United States Patent
Park et al.

(10) Patent No.: US 10,756,211 B2
(45) Date of Patent: Aug. 25, 2020

(54) SEMICONDUCTOR DEVICES INCLUDING SOURCE/DRAIN REGIONS HAVING MULTIPLE EPITAXIAL PATTERNS

(71) Applicant: Samsung Electronics Co., Ltd., Suwon-si, Gyeonggi-do (KR)

(72) Inventors: Keum Seok Park, Seongnam-si (KR); Jungho Yoo, Seongnam-si (KR); Jinyeong Joe, Suwon-si (KR); Bonyoung Koo, Suwon-si (KR); Dongsuk Shin, Yongin-si (KR); Hongsik Yoon, Seongnam-si (KR); Byeongchan Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 709 days.

(21) Appl. No.: 15/379,190

(22) Filed: Dec. 14, 2016

(65) Prior Publication Data

US 2017/0092767 A1 Mar. 30, 2017

Related U.S. Application Data

(63) Continuation of application No. 14/673,519, filed on Mar. 30, 2015, now Pat. No. 9,553,190.

(30) Foreign Application Priority Data

Jun. 26, 2014 (KR) .......................... 10-2014-0079057

(51) Int. Cl.
 *H01L 29/78* (2006.01)
 *H01L 29/165* (2006.01)
 (Continued)

(52) U.S. Cl.
 CPC .... *H01L 29/7848* (2013.01); *H01L 21/02532* (2013.01); *H01L 21/02636* (2013.01);
 (Continued)

(58) Field of Classification Search
 CPC ............... H01L 29/7848; H01L 29/785; H01L 29/66795
 See application file for complete search history.

(56) References Cited

U.S. PATENT DOCUMENTS

| | | |
|---|---|---|
| 8,264,021 B2 | 9/2012 | Lai et al. |
| 2011/0079829 A1 | 4/2011 | Lai et al. |

(Continued)

FOREIGN PATENT DOCUMENTS

| | | |
|---|---|---|
| KR | 1020110098594 | 9/2011 |
| KR | 1020130120201 | 11/2013 |
| KR | 1020140029094 | 3/2014 |

*Primary Examiner* — Sue A Purvis
*Assistant Examiner* — Scott Stowe
(74) *Attorney, Agent, or Firm* — Myers Bigel, P.A.

(57) ABSTRACT

A semiconductor device includes an active pattern protruding from a substrate, a gate structure crossing over the active pattern, and source/drain regions disposed on the active pattern at opposite sides of the gate structure. Each of the source/drain regions includes a first epitaxial pattern contacting the active pattern and a second epitaxial pattern on the first epitaxial pattern. The first epitaxial pattern comprises a material having a lattice constant which is the same as that of the substrate, and the second epitaxial pattern comprises a material having a lattice constant greater than that of the first epitaxial pattern.

20 Claims, 25 Drawing Sheets

(51) Int. Cl.
*H01L 29/66* (2006.01)
*H01L 21/02* (2006.01)
*H01L 29/06* (2006.01)
*H01L 29/08* (2006.01)
*H01L 29/45* (2006.01)

(52) U.S. Cl.
CPC ...... *H01L 29/0649* (2013.01); *H01L 29/0847* (2013.01); *H01L 29/165* (2013.01); *H01L 29/45* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 2011/0210393 A1 | 9/2011 | Chen et al. |
| 2011/0210404 A1 | 9/2011 | Su et al. |
| 2011/0278676 A1 | 11/2011 | Cheng et al. |
| 2012/0329252 A1 | 12/2012 | Yoo et al. |
| 2013/0049068 A1 | 2/2013 | Lin et al. |
| 2013/0052778 A1 | 2/2013 | Liao et al. |
| 2013/0056795 A1 | 3/2013 | Wu et al. |
| 2013/0089959 A1 | 4/2013 | Kwok et al. |
| 2013/0248948 A1 | 9/2013 | Ma et al. |
| 2013/0285143 A1 | 10/2013 | Oh et al. |
| 2014/0065782 A1 | 3/2014 | Kelly et al. |
| 2014/0191298 A1* | 7/2014 | Chen .................. H01L 29/401 257/288 |
| 2015/0364580 A1 | 12/2015 | Jangjian et al. |

* cited by examiner

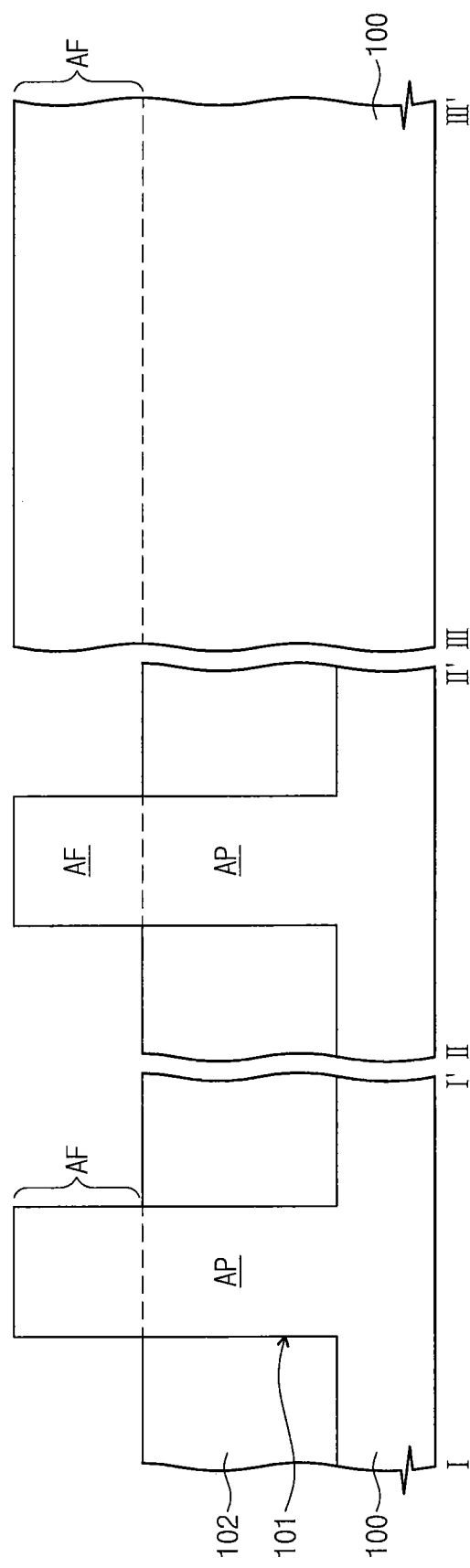

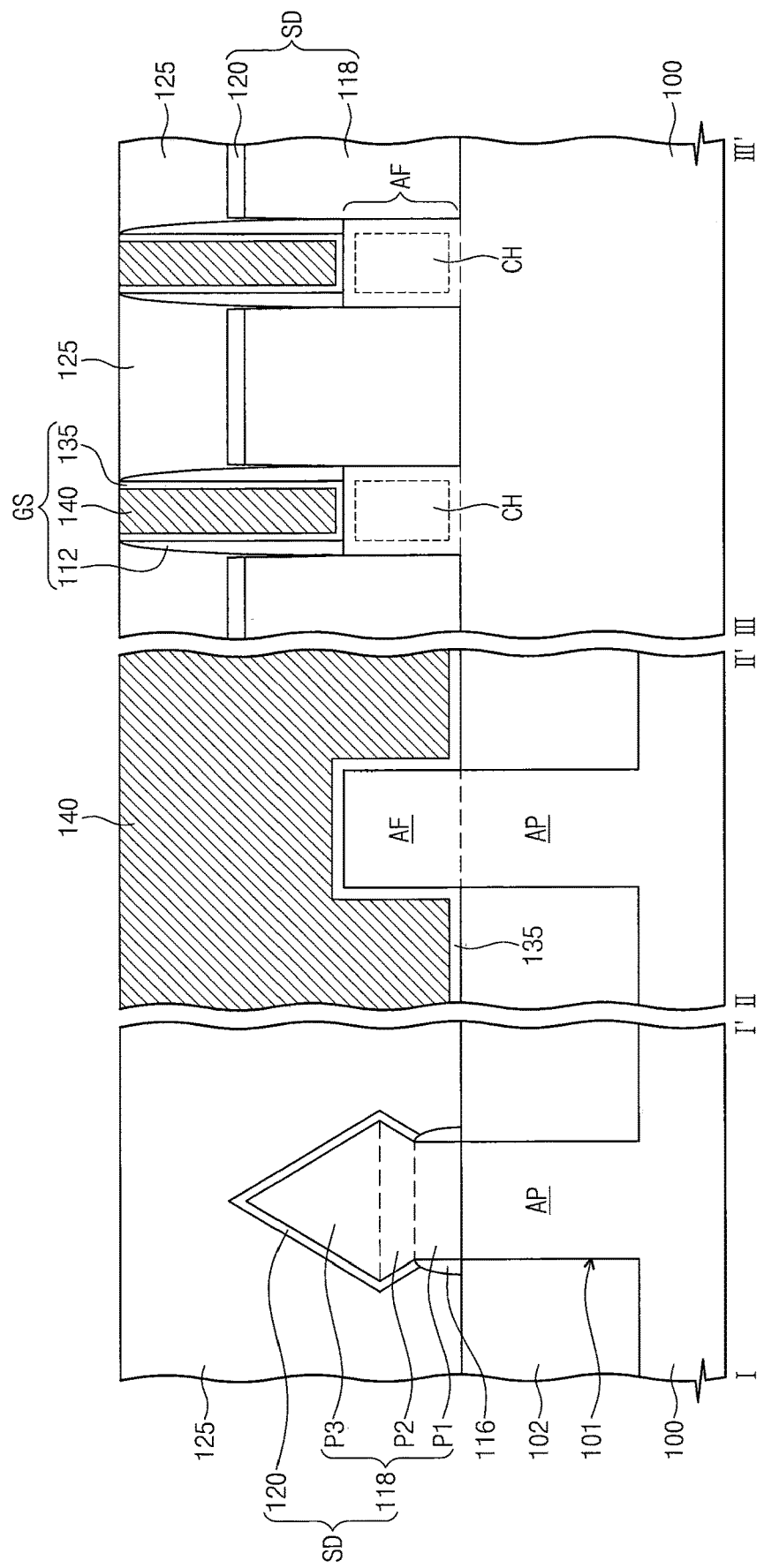

SEMICONDUCTOR DEVICES INCLUDING SOURCE/DRAIN REGIONS HAVING MULTIPLE EPITAXIAL PATTERNS

CROSS-REFERENCE TO RELATED APPLICATIONS

This U.S. non-provisional patent application is a continuation of U.S. patent application Ser. No. 14/673,519, filed Mar. 30, 2015, which itself claims priority under 35 U.S.C. § 119 to Korean Patent Application No. 10-2014-0079057, filed on Jun. 26, 2014, in the Korean Intellectual Property Office, the disclosure of both of which are hereby incorporated by reference in their entireties.

BACKGROUND

Example embodiments of the inventive concepts relate to semiconductor devices and methods of manufacturing the same, and in particular, to fin field effect transistors and methods of manufacturing the same.

A semiconductor device may include an integrated circuit (IC) made up of a plurality of Metal Oxide Semiconductor Field Effect Transistors (MOSFETs or MOS transistors for short). Reducing the size and design rule of such a semiconductor device, i.e., increasing the degree of integration of the semiconductor device, may thus require a scaling-down of MOS transistors. However, such a scaling-down of MOS transistors may lead to degradation in operational characteristics of the semiconductor device. Accordingly, research is being conducted on various techniques aimed at manufacturing highly integrated semiconductor devices that can offer better performance.

SUMMARY

In one aspect, a semiconductor device may include an active pattern protruding from a substrate, a gate structure crossing over the active pattern, and source/drain regions disposed on the active pattern at opposite sides of the gate structure. Each of the source/drain regions includes a first epitaxial pattern contacting the active pattern and a second epitaxial pattern on the first epitaxial pattern. The first epitaxial pattern comprises a material having a lattice constant which is the same as that of the substrate, and the second epitaxial pattern comprises a material having a lattice constant greater than that of the first epitaxial pattern. In other embodiments, an outer surface of the second epitaxial pattern is smoother (i.e., has less surface roughness) than an outer surface of the first epitaxial pattern at a boundary between the first and second epitaxial patterns.

In some embodiments, the active pattern may include a channel region disposed between the source/drain regions and under the gate structure. The gate structure extends on, and in some embodiments covers, side surfaces and a top surface of the channel region. The top surface of the channel region is lower than an uppermost surface of the first epitaxial pattern and is higher than a lower surface of the first epitaxial pattern.

In some embodiments, the first epitaxial pattern comprises: a first portion contacting the active pattern, a second portion extending from the first portion, the second portion having a width increasing with distance away from the substrate, and a third portion extending from the second portion, the third portion having a width decreasing with distance away from the substrate. The first epitaxial pattern has a maximum width at a boundary between the second portion and the third portion.

In some embodiments, the second epitaxial pattern may extend on, and in some embodiments cover, opposite sidewalls of the second and third portions. In some embodiments, the second epitaxial layer is between about 1 nm and about 10 nm thick.

In some embodiments, the semiconductor device may further include device isolation patterns disposed on the substrate at opposite sides of the active pattern, and auxiliary spacers disposed on the device isolation patterns. The auxiliary spacers extend on, and in some embodiments cover, the first portion and expose the second portion and the third portion.

In some embodiments, the gate structure may include: a gate electrode crossing over the active pattern, gate spacers on opposite sidewalls of the gate electrode, and a gate dielectric pattern between the active pattern and the gate electrode. The active pattern extends in a first direction and the gate electrode extends in a second direction intersecting the first direction.

In some embodiments, the first and the second epitaxial patterns may include n-type impurities.

In some embodiments, the first epitaxial pattern may include silicon (Si) and the second epitaxial pattern may include silicon germanium (SiGe).

In some embodiments, a germanium (Ge) concentration of the second epitaxial pattern may have a range of about 1 to about 10 atom %.

In some embodiments, the semiconductor device may further include an interlayer insulating layer on, and in some embodiments covering, the gate structure, and contact plugs disposed in a contact hole that penetrates the interlayer insulating layer and the second epitaxial pattern and exposes a portion of the first epitaxial pattern, the contact plugs connected to the portion of the first epitaxial pattern. The portion of the first epitaxial pattern has an upper surface contacting the contact plug, and the upper surface is parallel to a top surface of the substrate.

In some embodiments, the first epitaxial pattern comprises: a first portion contacting the active pattern, the first portion having a width increasing with distance away the substrate, and a second portion extending from the first portion, the second portion having a width decreasing with distance away from the substrate. The first epitaxial pattern has a maximum width at a boundary between the first portion and the second portion, and the second epitaxial pattern is on, and in some embodiments covers, opposite sidewalls of the first and second portions.

In one aspect, a method of manufacturing a semiconductor device may include: forming an active pattern protruding from a substrate; forming a sacrificial gate pattern crossing over the active pattern; forming source/drain regions on the active pattern at opposite sides of the sacrificial gate pattern; and replacing the sacrificial gate pattern with a gate electrode. The active pattern may include a channel region under the gate electrode and between the source/drain regions. The forming source/drain regions comprises: performing a selective epitaxial growth process using the active pattern as a seed layer to form a first epitaxial pattern; and performing a selective epitaxial growth process using the first epitaxial pattern as a seed layer to form a second epitaxial pattern. The first epitaxial pattern is formed to induce a tensile strain to the channel region and the second epitaxial pattern is formed to have a surface roughness less than that of the first epitaxial pattern. Related semiconductor devices may also be provided according to other embodiments.

In some embodiments, the second epitaxial pattern may include a material having a lattice constant which is the same as that of the substrate. A process for forming the second epitaxial pattern is performed at a pressure range lower than that at which the first epitaxial pattern is performed.

In some embodiments, the second epitaxial pattern may include silicon germanium (SiGe) and a germanium (Ge) concentration of the second epitaxial pattern may have a range of about 1 to about 10 atom %.

In some embodiments, the method may further include doping n-type impurities into the first and second epitaxial patterns. The doping n-type impurities may include: performing in-situ doping during formation of the first and second epitaxial patterns, and/or performing an ion-implantation process after forming the first and second epitaxial patterns.

BRIEF DESCRIPTION OF THE DRAWINGS

The inventive concepts will become more apparent in view of the attached drawings and accompanying detailed description.

FIGS. 2A through 9A are perspective views illustrating a method of manufacturing a semiconductor device according to some embodiments of the inventive concepts.

FIGS. 2B through 9B are cross-sectional views taken along lines I-I', II-II', and III-III' of FIGS. 2A through 9A, respectively.

DETAILED DESCRIPTION OF THE EMBODIMENTS

Figure 1A:
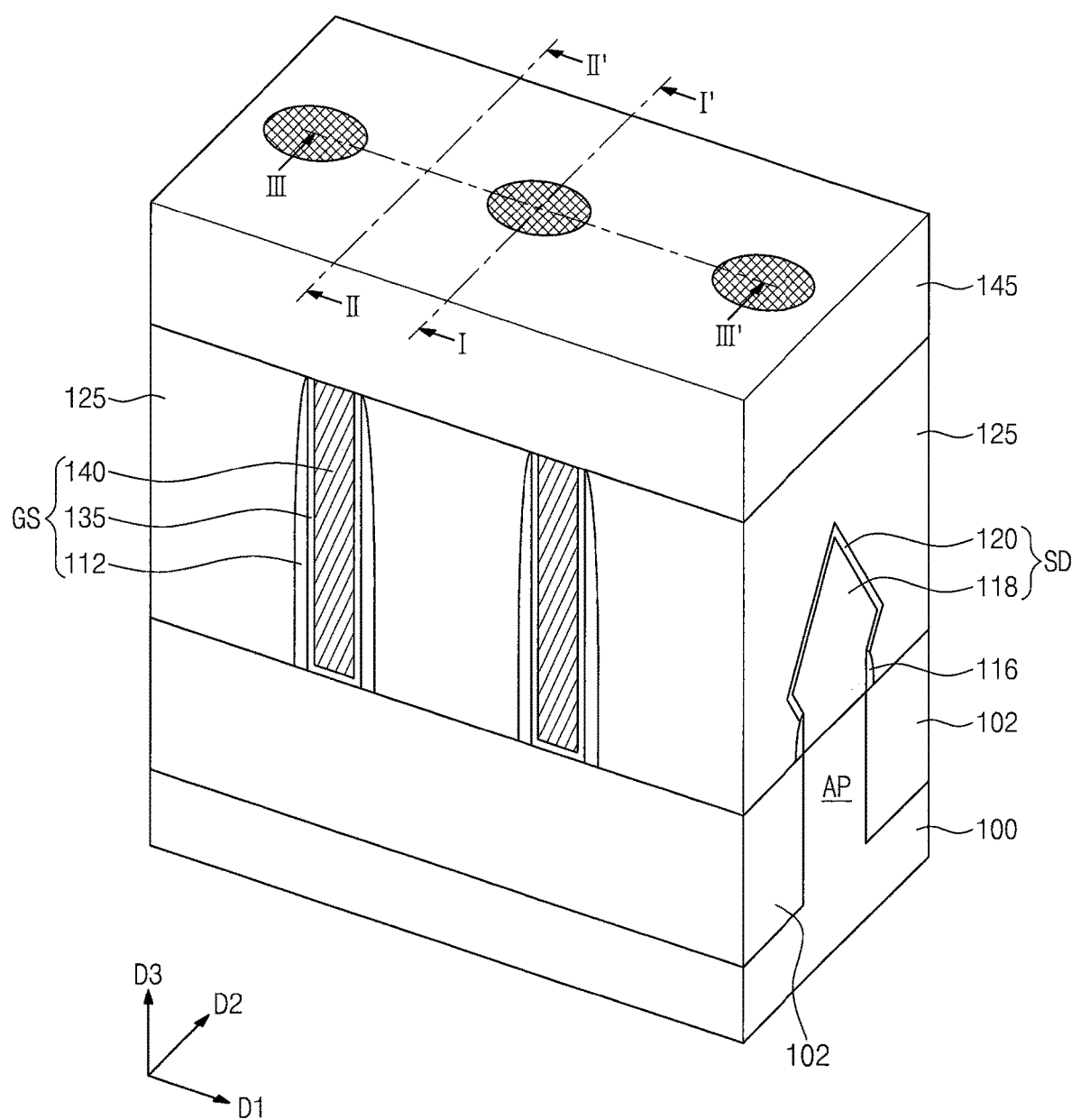
FIG. 1A is a perspective view illustrating a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and various sizes, thicknesses and relative sizes and relative thicknesses may be exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including" and variants thereof, when used herein, specify the presence of stated features, steps, operations, elements and/or components, but do not preclude the presence or addition of one or more other features, steps, operations, elements, components and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
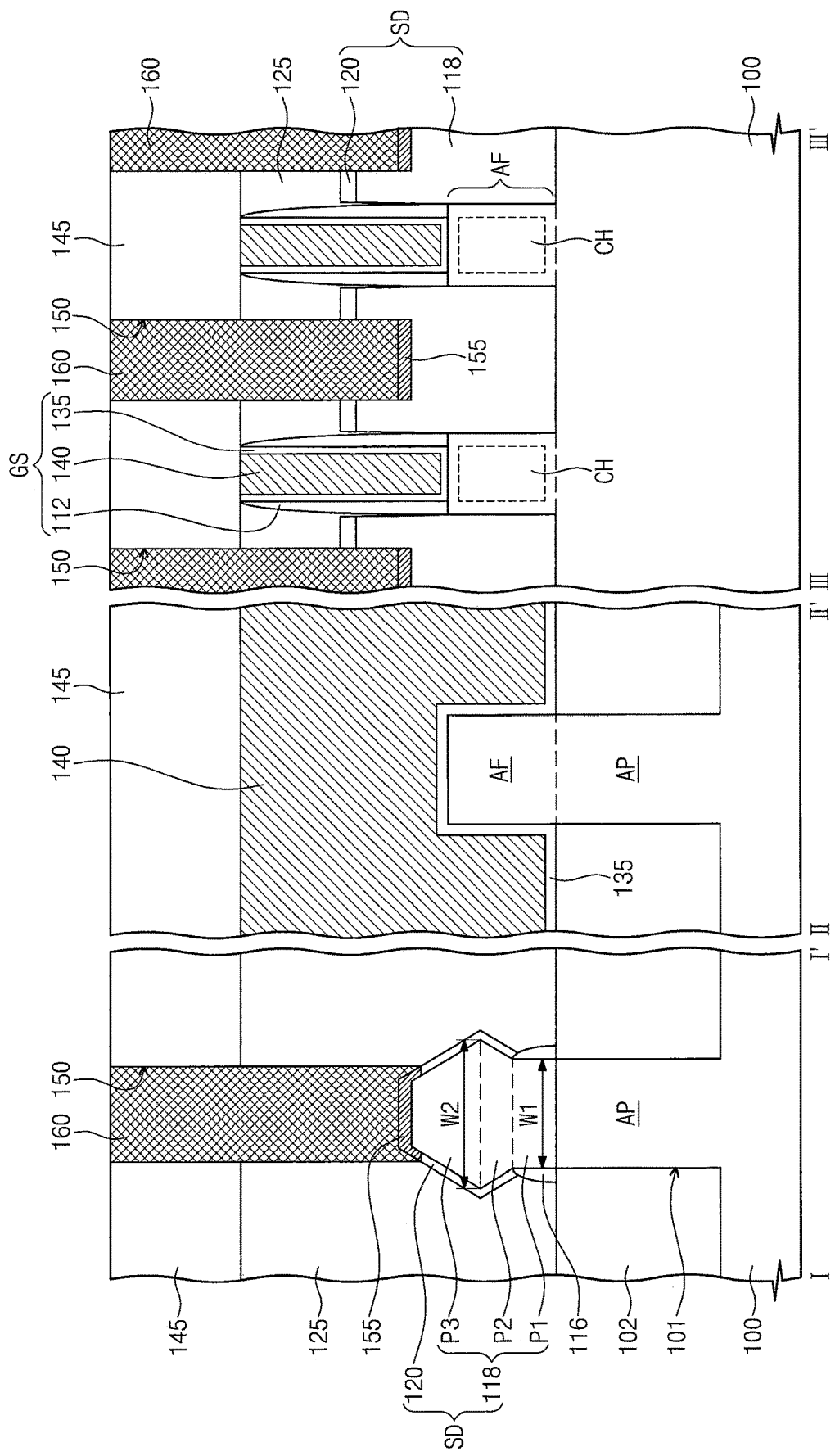
FIG. 1B is a cross-sectional view taken along lines I-I', II-II', and III-III' of FIG. 1A.

FIG. 1A is a perspective view illustrating a semiconductor device according to some embodiments of the inventive concepts. FIG. 1B is a cross-sectional view taken along lines I-I', II-II', and III-III' of FIG. 1A.

Referring to FIGS. 1A and 1B, an active pattern AP and a gate structure GS crossing over the active pattern AP may be provided on a substrate 100.

The substrate 100 may be a semiconductor substrate. For example, the substrate 100 may be a bulk silicon or other semiconductor substrate or a Silicon-On-Insulator (SOI) substrate. The active pattern AP may have a linear shape extending in a first direction D1. In detail, the active pattern AP may have a longitudinal axis in the first direction D1 and a short axis in a second direction D2 perpendicular to the first direction D1. The active pattern AP may vertically protrude from a top surface of the substrate 100. The active pattern AP may project in a third direction D3 perpendicular to the first direction D1 and the second direction D2. In this embodiment, one active pattern AP is illustrated, but the number of the active pattern AP may be appropriately varied, and thus, some embodiments may not be limited thereto.

The gate structure GS may be provided in plural and a plurality of gate structures GS may cross over at least one active pattern AP. For example, a pair of the gate structures GS may be spaced apart from to each other in the first direction D1 and cross over the active pattern AP. The pair of the gate structures GS may extend in the second direction D2. Hereinafter, for the sake of brevity, one pair of the gate structures GS crossing over one active pattern AP will be described.

Device isolation patterns 102 may be disposed on opposite sides of the active pattern AP. For example, the device isolation patterns 102 may include oxide, nitride and/or oxynitride. The device isolation patterns 102 may extend on, and in some embodiments may cover, a part of a sidewall of the active pattern AP. In other words, an upper portion of the active pattern AP may be exposed by the device isolation patterns 102. The upper portion of the active pattern AP may be an active fin AF. The active fin AF may be locally disposed under each of the gate structures GS. In other words, the gate structures GS may cross over the active pattern AP and extend on, and in some embodiments cover, a top surface and side surface of the active fin AF. Hereinafter, a channel region CH may correspond to a portion of the active fin AF locally disposed under the gate structures GS.

Each of the gate structures GS may include a gate electrode 140 crossing over the active pattern AP, gate spacers 112 on opposite sidewalls of the gate electrode 140, and a gate dielectric pattern 135 between the gate electrode 140 and the gate spacers 112. The gate dielectric pattern 135 may be disposed between the gate electrode 140 and the gate spacers 112 and horizontally extend on, and in some embodiments to cover, top surfaces of the device isolation patterns 102. The gate dielectric pattern 135 may extend along a bottom surface of the gate electrode 140.

The gate electrode 140 may include at least one metal material. For example, the gate electrode 140 may include titanium, tungsten, tantalum and/or aluminum. In other example, the gate electrode 140 may include a conductive metal nitride (e.g. titanium nitride and/or tantalum nitride) and a metal (e.g. aluminum and/or tungsten) stacked in a sequential manner. The gate spacer 112 may include silicon nitride. In other example, the gate spacers 112 may include low-k dielectric materials such as SiCN and/or SiOCN. In some embodiments, the gate dielectric pattern 135 may include high-k dielectric materials having a higher dielectric constant than silicon oxide. For example, the gate dielectric pattern 135 may include hafnium oxide, hafnium silicate, zirconium oxide and/or zirconium silicate.

Source/drain regions SD may be disposed on the active pattern AP at opposite sides of the pair of gate structures GS and between the pair of gate structures GS. Auxiliary spacers 116 may be disposed on the device isolation patterns 102 at opposite sides of the pair of gate structures GS and between the pair of gate structures GS. A pair of the auxiliary spacers 116 disposed at any one side of the gate structures GS may be spaced apart from each other in the second direction D2 with the active pattern AP interposed therebetween. The auxiliary spacers 116 may be in contact with lower portions of the source/drain regions SD. Each of the auxiliary spacers 116 may extend in the first direction D1 and be in contact with the gate spacer 112. In detail, each of the auxiliary spacers 116 may extend along a boundary between the device isolation pattern 102 and the source/drain regions SD to contact the gate spacer 112. The auxiliary spacers 116 may comprise the same material as the gate spacer 112. For example, the auxiliary spacers 116 may include silicon nitride and/or low-k dielectric materials such as SiCN and/or SiOCN.

Each of the source/drain regions SD may include a first epitaxial pattern 118 and a second epitaxial pattern 120 on the first epitaxial pattern 118. The first epitaxial pattern 118 may be formed by an epitaxial growth process using the active pattern AP as a seed layer. The first epitaxial pattern 118 may include a first portion P1, a second portion P2 on the first portion P1, and a third portion P3 on the second portion P2. The first portion P1 may be in contact with the active pattern AP and, in some embodiments, may be covered by the auxiliary spacers 116. In some embodiments, the first epitaxial pattern 118 may have a width depending on a distance from the substrate 100. The width is a distance in the second direction D2 and a distance between both sidewalls of each the first epitaxial pattern 118. In detail, the second portion P2 may have a width increasing with distance away from the substrate 100. The third portion P3 may have a width decreasing with distance away from the substrate 100. The first portion P1 may have a first width W1 corresponding to a distance between the auxiliary spacers 116 adjacent to each other in the second direction D2. The first epitaxial pattern 118 may have a second width W2 at a boundary between the second portion P2 and the third portion P3. The second width W2 may be the maximum width of the first epitaxial pattern 118. An uppermost surface of the first epitaxial pattern 118 may be higher than a top surface of the channel region CH between the source/drain regions SD. A bottom surface of the first epitaxial pattern 118 may be lower than the top surface of the channel region CH.

In some embodiments, the semiconductor device including the first epitaxial pattern 118 may be an NMOS transistor. In this case, the first epitaxial pattern 118 may include a material having a lattice constant equal to or less than that of the substrate 100. For example, when the substrate is a silicon substrate, the first epitaxial pattern 118 may include a silicon carbide (SiC) layer having a lattice constant less than that of silicon (Si) and/or may include a silicon (Si) layer having a lattice constant equal to that of the substrate 100. In this case, the first epitaxial pattern 118 may be configured to induce a tensile strain to the channel region CH. As a result, it is possible to increase mobility of majority carriers (i.e., electrons) in the channel region CH of the NMOS transistor. And, the first epitaxial pattern 118 may include n-type impurities (e.g., phosphorous (P) and/or arsenic (As)).

The second epitaxial pattern 120 may be disposed on a sidewall of the first epitaxial pattern 118 exposed by the auxiliary spacers 116. That is, the second epitaxial pattern 120 may be disposed on opposite sidewalls of the second and third portions P2 and P3 of the first epitaxial pattern 118. The second epitaxial pattern 120 may have a thickness of about 1 to about 10 nm. The second epitaxial pattern 120 may be conformal to the sidewalls of the second and third portions P2 and P3 of the first epitaxial pattern 118, such that the opposite faces of the second epitaxial pattern 120 generally conform to the underlying sidewalls of the second and third portions P2 and P3 of the first epitaxial pattern 118. In an embodiment, the second epitaxial pattern 120 may be undoped. In other embodiments, the second epitaxial pattern 120 may include n-type impurities such as phosphorous (P). In some embodiments, the second epitaxial pattern 120 may include the same material as the first epitaxial pattern 118. For example, if the first epitaxial pattern 118 may comprise silicon (Si), the second epitaxial pattern 120 may comprise silicon (Si). In other embodiments, the second epitaxial pattern 120 may include a material having a lattice constant greater than that of the first epitaxial pattern 118. For example, if the first epitaxial pattern 118 may comprise silicon (Si), the second epitaxial pattern 120 may comprise silicon germanium (SiGe). In this case, a germanium (Ge) concentration of the second epitaxial pattern 120 may have a range of about 1 to about 10 atom %. In still other embodiments, the second epitaxial pattern 120 may include a silicon (Si) layer and a silicon germanium (SiGe) layer stacked in a sequential manner.

A first interlayer insulating layer 125 may be disposed on the substrate 100 to extend on, and in some embodiments to cover, the source/drain regions SD. A top surface of the first interlayer insulating layer 125 may be coplanar with the top surfaces of the gate structures GS. The first interlayer insulating layer 125 may include silicon oxide, silicon nitride, silicon oxynitride and/or low-k dielectric materials. In addition, a second interlayer insulating layer 145 may be disposed on the first interlayer insulating layer 125 on, and in some embodiments to cover, the top surfaces of the gate structures GS. The second interlayer insulating layer 145 may include silicon oxide, silicon nitride, silicon oxynitride and/or low-k dielectric materials.

Contact plugs 160 may be connected to the source/drain regions SD. The contact plugs 160 may be disposed in contact holes 150 which penetrate the second interlayer insulating layer 145, the first interlayer insulating layer 125, and the second epitaxial pattern 120 to expose the first epitaxial pattern 118. A portion of the first epitaxial pattern 118 exposed by each of the contact holes 150 may have a top surface which is parallel to a top surface of the substrate 100. In some embodiments, a silicide pattern 155 may be disposed between the contact plugs 160 and the first epitaxial pattern 118 exposed by each of the contact holes 150. The silicide pattern 155, for example, may include nickel silicide, cobalt silicide, tungsten silicide, titanium silicide, niobium silicide and/or tantalum silicide. Although not shown in the drawings, interconnection layers may be disposed on the second interlayer insulating layer 145 to connect the contact plugs 160. The interconnection layers may include conductive materials.

FIGS. 2A through 9A are perspective views illustrating a method of manufacturing a semiconductor device according to some embodiments of the inventive concepts. FIGS. 2B through 9B are cross-sectional views taken along lines I-I', II-II', and III-III' of FIGS. 2A through 9A, respectively. FIGS. 10A and 10B are enlarged views of a portion 'A' of FIG. 6B to show surface roughness of source/drain regions according to some embodiments of the inventive concepts.

Figure 2A:
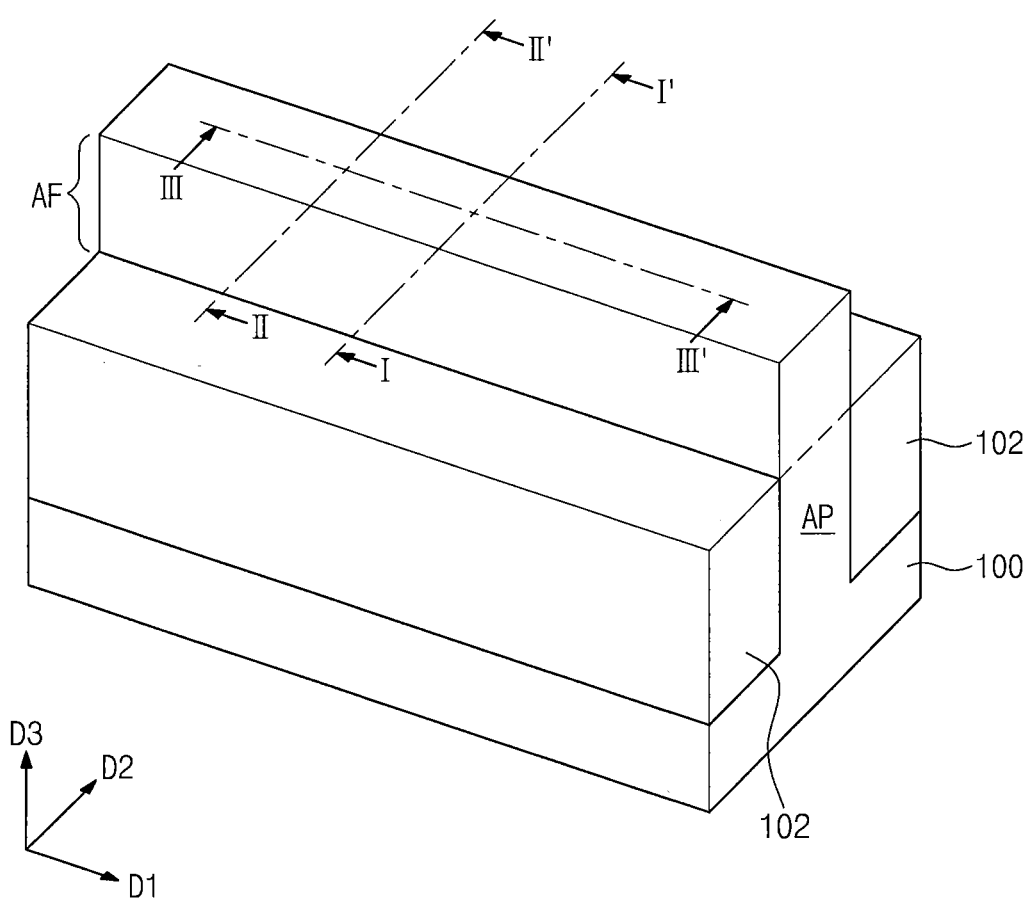

Referring to FIGS. 2A and 2B, a substrate 100 may be patterned to form trenches 101 defining active patterns AP. Specifically, The formation of the active pattern AP may include forming a mask pattern (not shown) on the substrate 100 and etching the substrate 100 anisotropically using the mask pattern as an etch mask. The trenches 101 may extend in a first direction D1 and be spaced apart from each other in a second direction D2. The active pattern AP may have a linear shape elongating along the first direction D1. In some embodiments, the trenches 101 may have a downward tapered shape, and the active pattern AP may have an upward tapered shape. The active pattern AP may provide in plural and the active patterns AP may extend in the first direction D1 and be spaced apart from each other in the second direction D2. The substrate 100 may be provided in a form of a bulk silicon or other semiconductor wafer or a SOI wafer. However, some embodiments of the inventive concepts are not limited to those described herein.

The device isolation patterns 102 may be formed to expose an upper sidewall of the active pattern AP. Top surfaces of the device isolation patterns 102 may be disposed at a level lower than a top surface of the active pattern AP. In detail, a device isolation layer may be formed in, and in some embodiments to fill, the trenches 101, and then a planarizing process is performed to expose the mask pattern (not shown) on the active pattern AP. Next, a planarized surface of the device isolation layer may be recessed to form the device isolation patterns 102 exposing the upper sidewall of the active pattern AP. Herein, the device isolation layer may comprise silicon oxide and be formed by using a chemical vapor deposition (CVD) process. An etch-back process or a chemical mechanical polishing (CMP) process may be used as the planarizing process for the device isolation layer. The planarized surface of the device isolation layer may be recessed by performing a wet etching process. The etching of the device isolation layer may be performed using an etch recipe having an etch selectivity with respect to the active pattern AP. In this case, an upper portion of the active pattern AP exposed by the device isolation patterns 102 may be defined as an active fin AF. The mask pattern may be removed after forming the device isolation patterns 102.

Figure 3A:
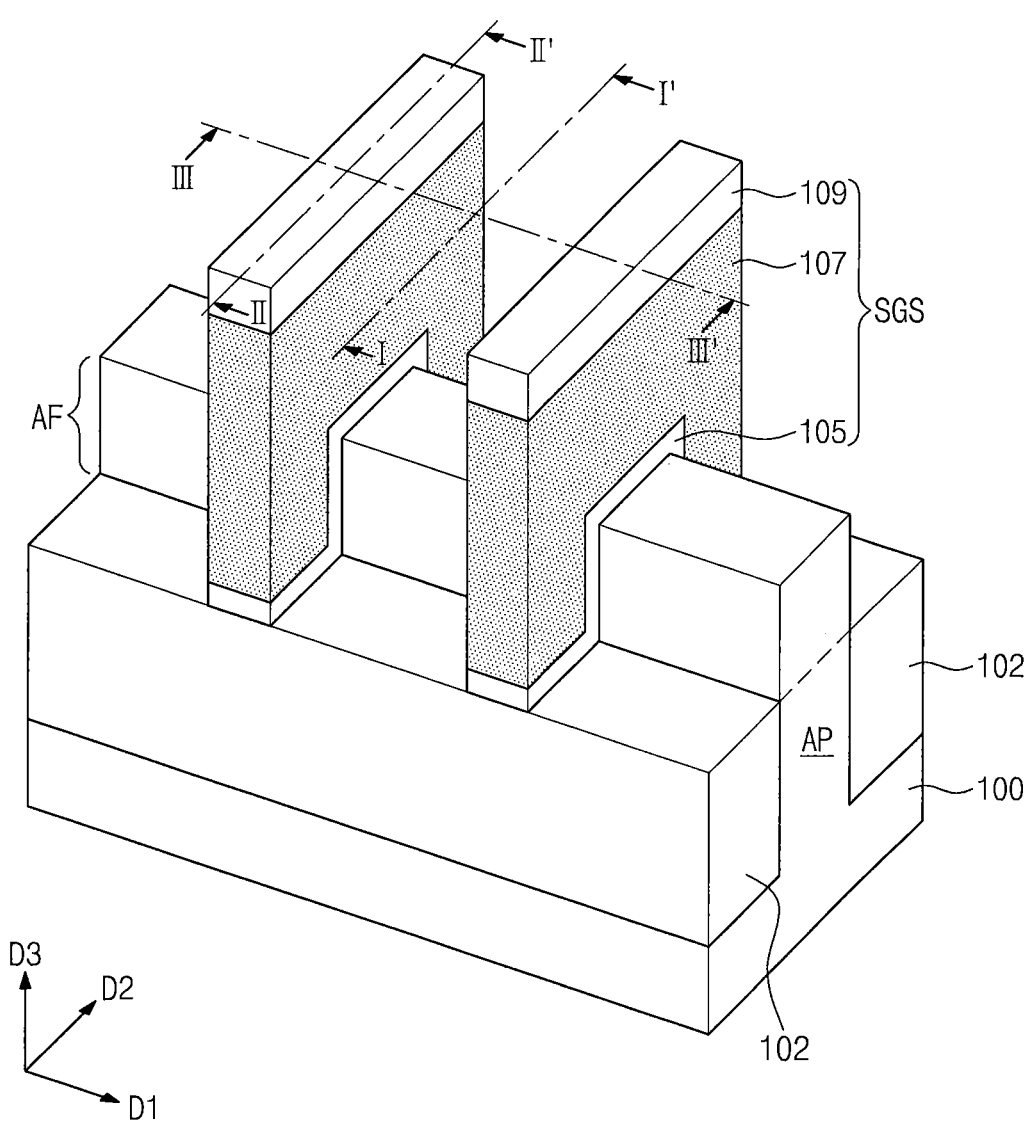
Figure 3B:
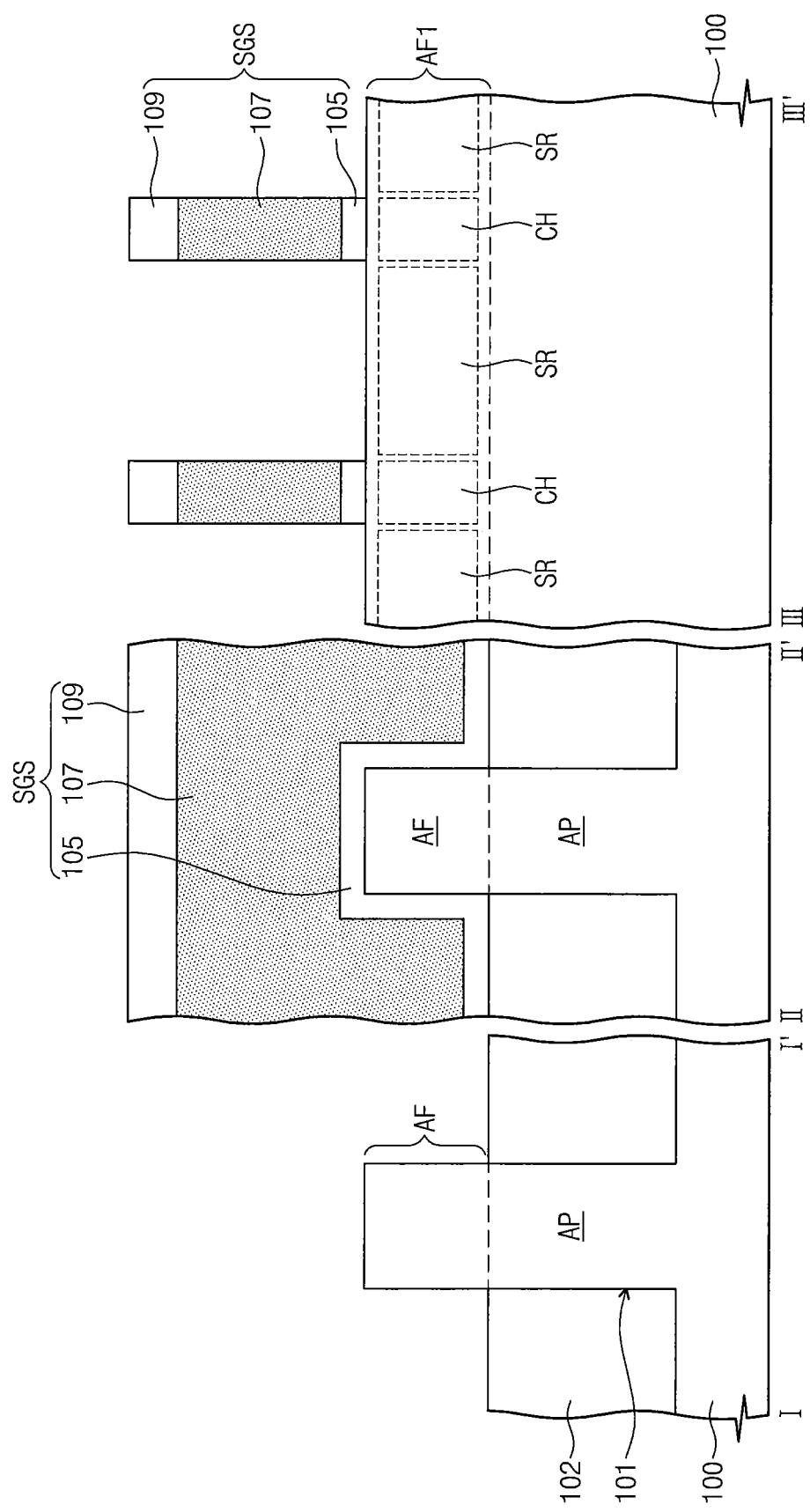

Referring to FIGS. 3A and 3B, an etch stop pattern 105 may be formed to cross over the active fin AF and a sacrificial gate pattern 107 may be formed on the etch stop pattern 105.

In some embodiments, an etch stop layer and a sacrificial gate layer may be sequentially formed on, and in some embodiments to cover, the active fin AF on the substrate 100. For example, the etch stop layer may include silicon oxide. The sacrificial gate layer may include a poly-silicon layer. The sacrificial gate layer may be formed by chemical vapor deposition (CVD), physical vapor deposition (PVD) and/or atomic layer deposition (ALD). After forming the sacrificial gate layer, a top surface of the sacrificial gate layer may be planarized. A gate mask pattern 109 may be formed on the planarized top surface of the sacrificial gate layer, and then an anisotropic etching process may be performed by using the gate mask patterns 109 as an etch mask. As a result, the sacrificial gate pattern 107 crossing over the active fin AF may be formed. The sacrificial gate pattern 107 may be provided in plural and cross over at least one the active fin AF. In some embodiments, a pair of the sacrificial gate patterns 107 may be spaced apart from each other in the first direction D1 and extend in the second direction D2 perpendicular to the first direction D1 to cross the active fin AF. The gate mask patterns 109 may comprise silicon nitride.

After forming the sacrificial gate patterns 107, the etch stop layer exposed by the sacrificial gate patterns 107 may be etched to form a etch stop pattern 105 under each of the sacrificial gate patterns 109. The etch stop pattern 105 may extend along a bottom surface of each of the sacrificial gate patterns 109 on, and in some embodiments to cover, portions of the device isolation patterns 102.

As the sacrificial gate pattern 107 is formed to cross over the active fin AF, channel regions CH and sacrificial regions SR may be defined in the active fin AF. Here, the channel regions CH may be portions of the active fin AF positioned below the sacrificial gate patterns 107. The sacrificial regions SR may be other portions of the active fin AF positioned at opposite sides of the sacrificial gate patterns 107. The sacrificial regions SR may be horizontally separated from each other by the channel regions CH. The etch stop pattern 105, the sacrificial gate pattern 107, and the gate mask patterns 109 may constitute a sacrificial gate structure SGS.

Figure 4A:
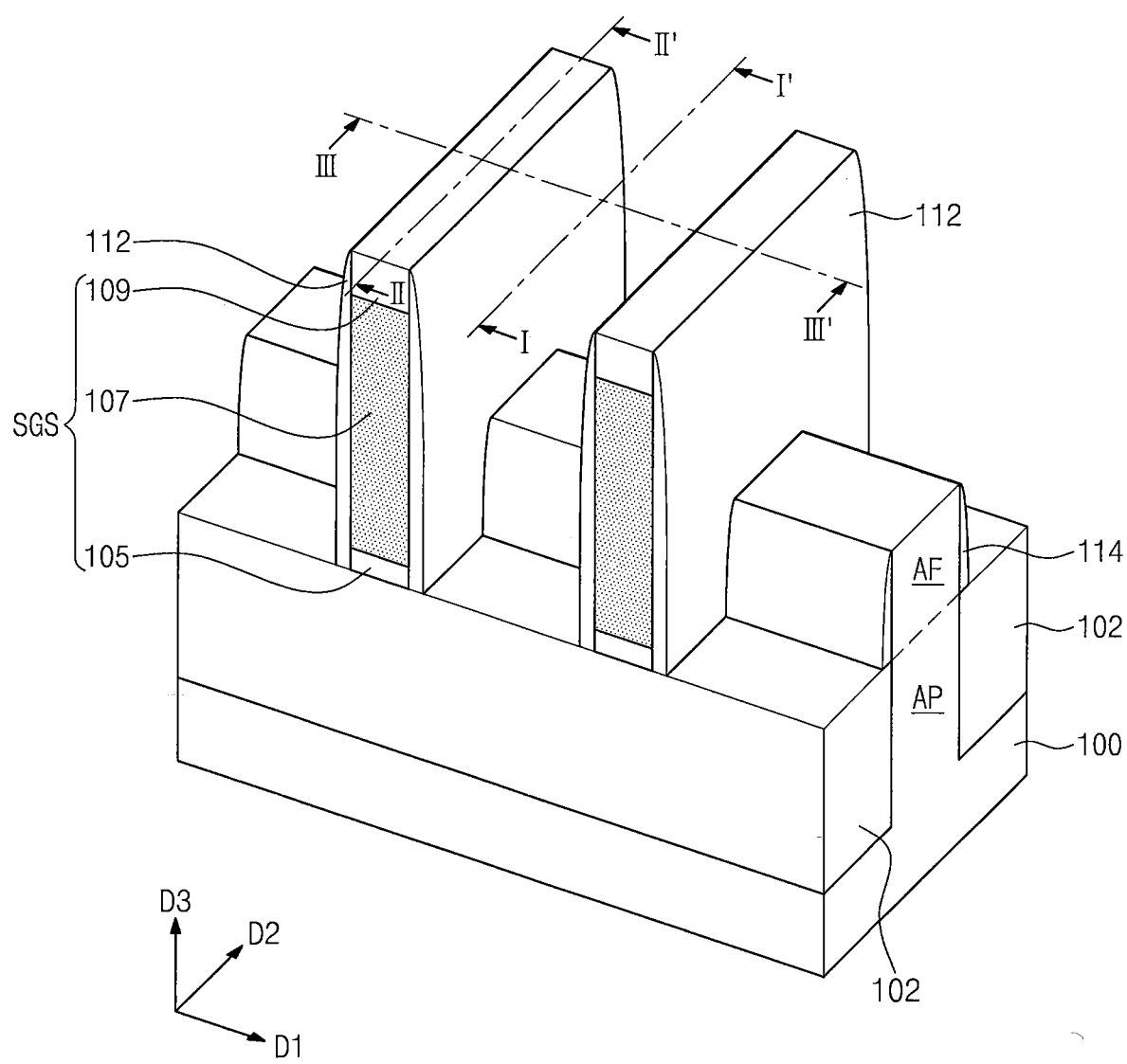
Figure 4B:
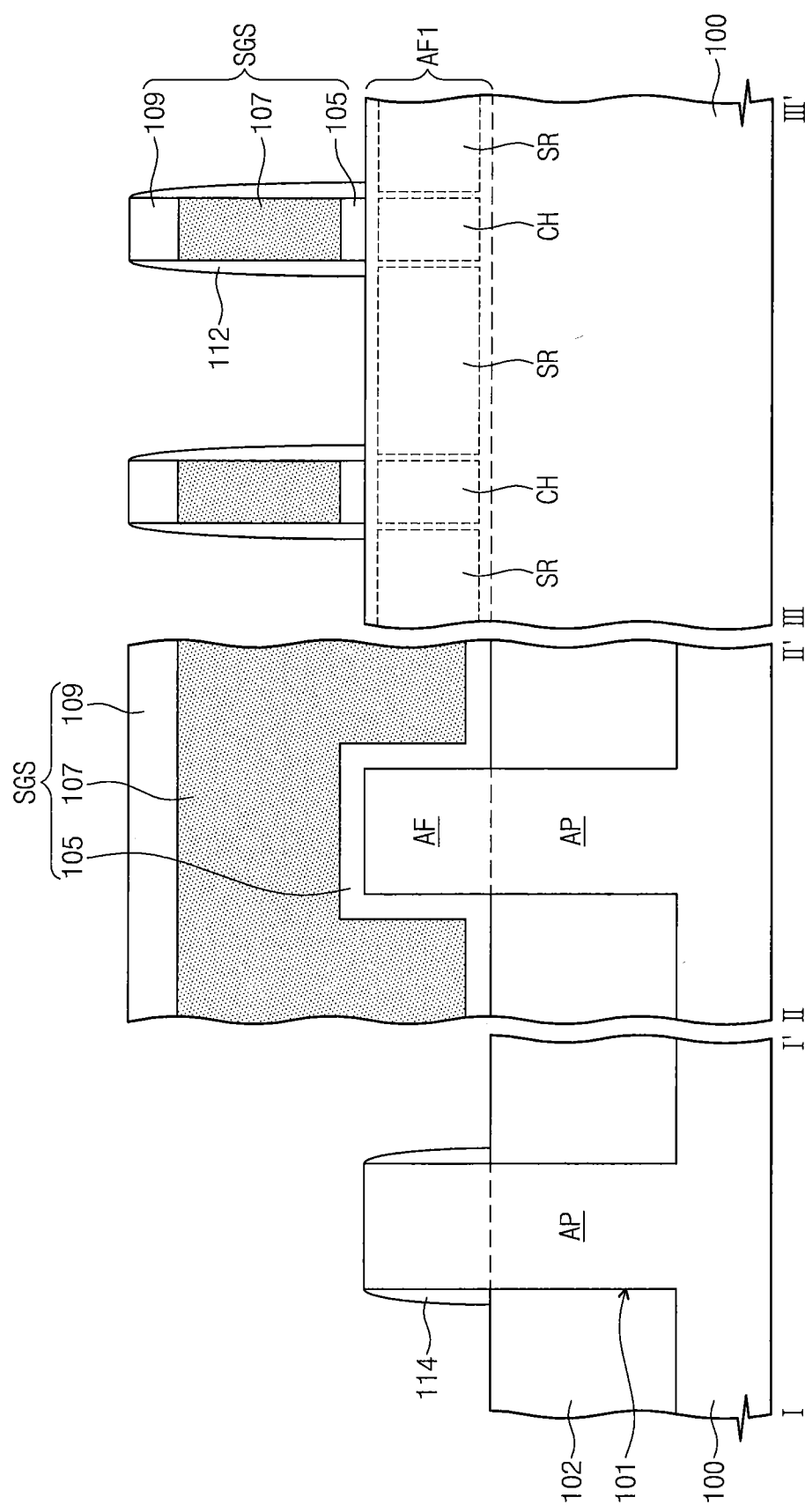

Referring to FIGS. 4A and 4B, gate spacers 112 may be formed at opposite sidewalls of the sacrificial gate structure SGS. In some embodiments, the formation of the gate spacers 112 may include forming a gate spacer layer conformally on the substrate 100 provided with the sacrificial gate structures SGS, and etching the gate spacer layer anisotropically to expose top surfaces of the sacrificial gate structures SGS. As a result, top surfaces of the sacrificial regions SR of the active fin AF and top surfaces of the device isolation patterns 102 at opposite sides of the sacrificial regions SR may be exposed. Further, fin spacers 114 may be formed at opposite sidewalls of the sacrificial regions SR. The fin spacers 114 may be portions of the spacer layer remaining on the active fin AF after the anisotropic etching. In some embodiments, the gate spacer layer may include silicon nitride. In other embodiments, the gate spacer layer may include low-k dielectric materials such as SiCN and/or SiOCN. The gate spacer layer may be formed by using a deposition process like CVD and/or ALD.

Figure 5A:
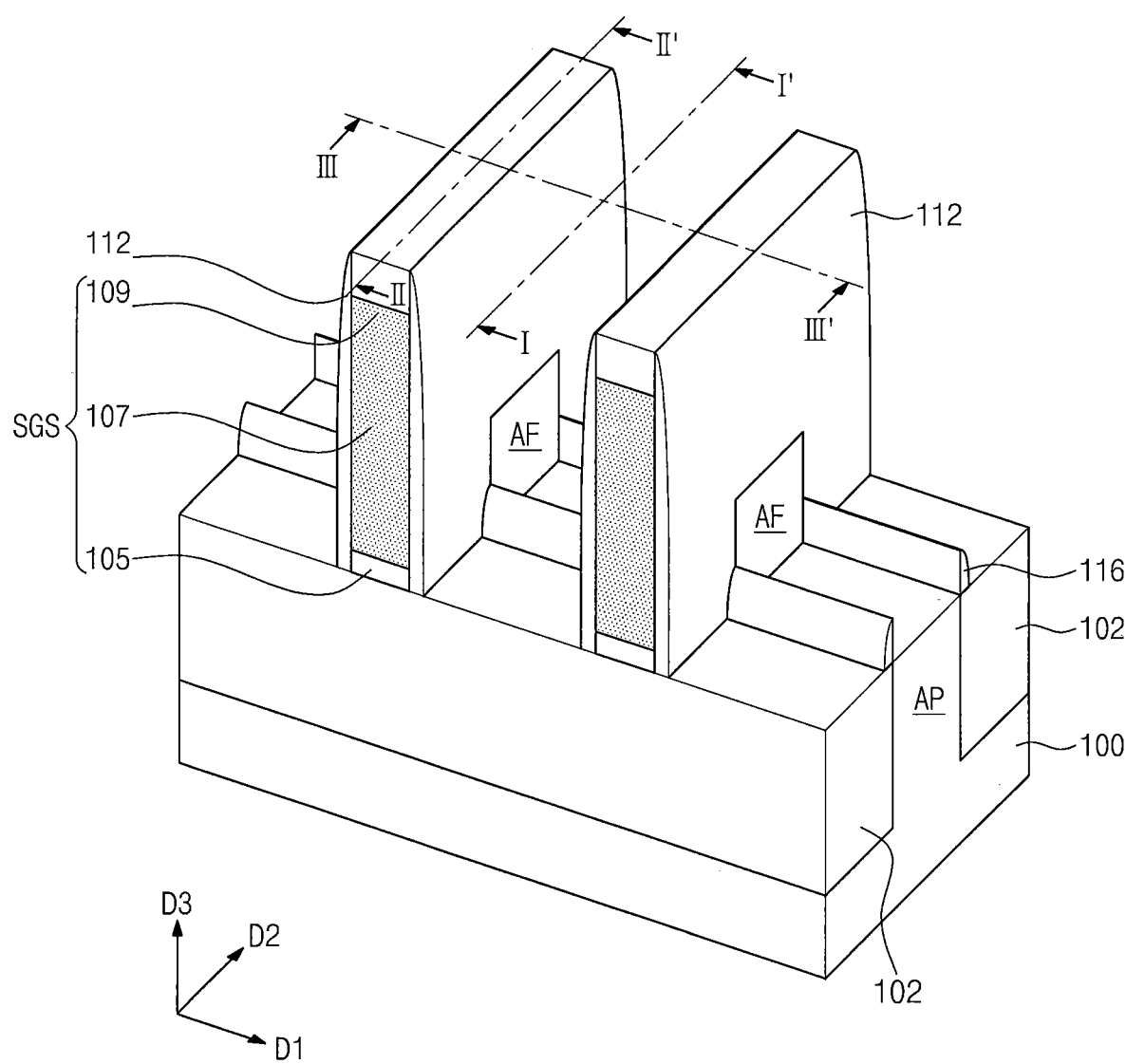
Figure 5B:
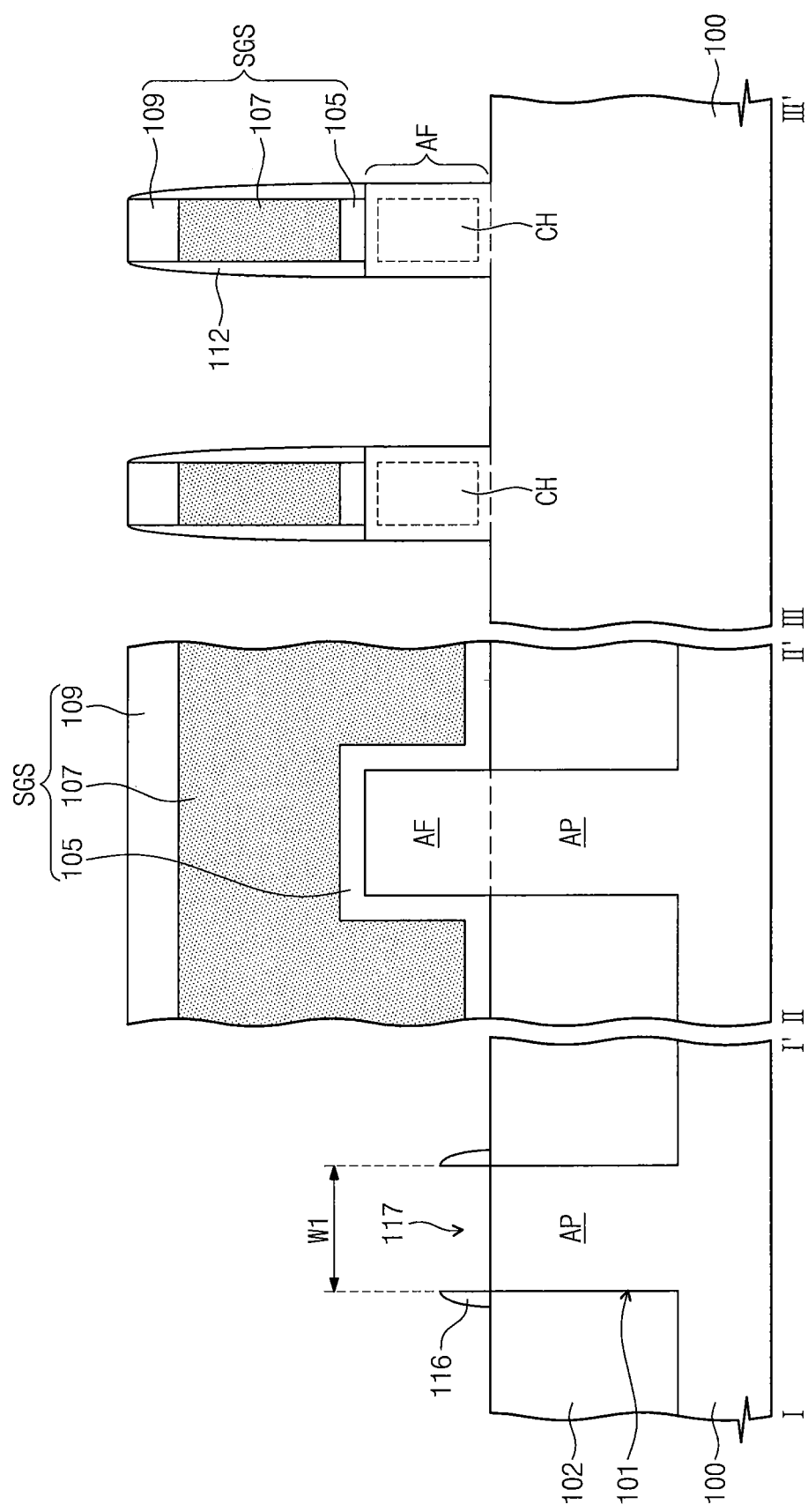

Referring to FIGS. 5A and 5B, isotropic etching process and/or anisotropic etching process may be performed to remove the sacrificial regions SR of the active fin AF in FIGS. 4A and 4B. In some embodiments, the etching process for removing the sacrificial regions SR may be performed by using an etch recipe having a high selectivity with respect to the fin spacers 114 of FIGS. 4A and 4B. That is, during the etching process to remove the first sacrificial regions SR, an etch rate of the fin spacers 114 may be relatively slow. Thus, after the etching process, a remaining portion of the fin spacers 114 may remain on the device isolation patterns 102. The remaining portion of the fin spacers 114, which is not etched by the etching process, is defined as auxiliary spacers 116. The auxiliary spacers 116 may be formed on the device isolation patterns 102 between the sacrificial gate structures SGS and at opposite sides of the sacrificial gate structures SGS. The auxiliary spacers 116 disposed at any one side of the sacrificial gate structures SGS may be spaced apart from each other in the second direction D2 with the active pattern AP interposed therebetween. Each of the auxiliary spacers 116 may extend along a boundary between the active pattern AP and the device isolation patterns 102 and be in contact with the gate spacers 112. Accordingly, the auxiliary spacers 116 may define grooves 117 on the active pattern AP between the sacrificial gate structures SGS and at both sides of the sacrificial gate patterns SGS. The grooves 117 may have a first width W1 in the second direction D2.

Figure 6A:
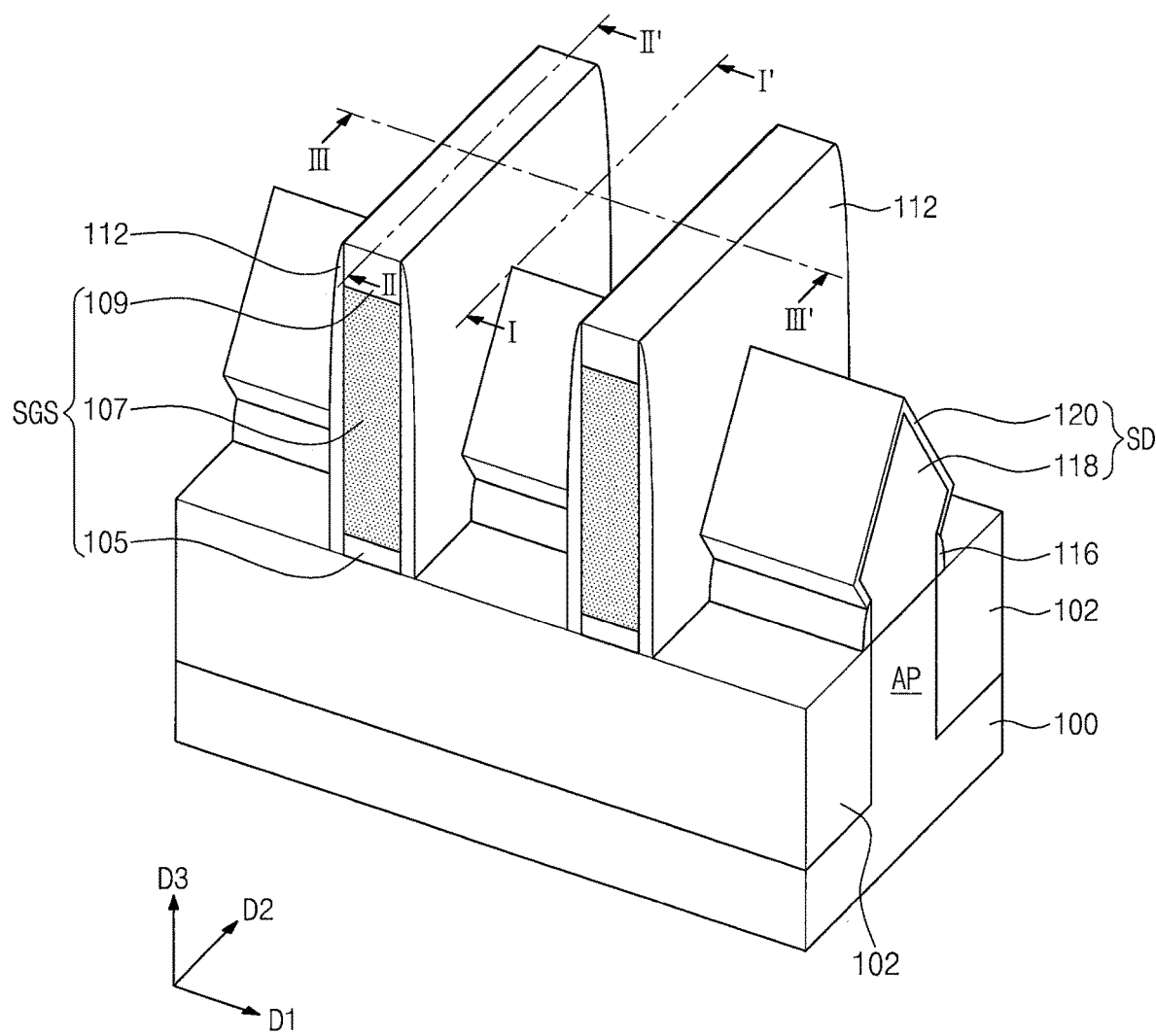
Figure 6B:
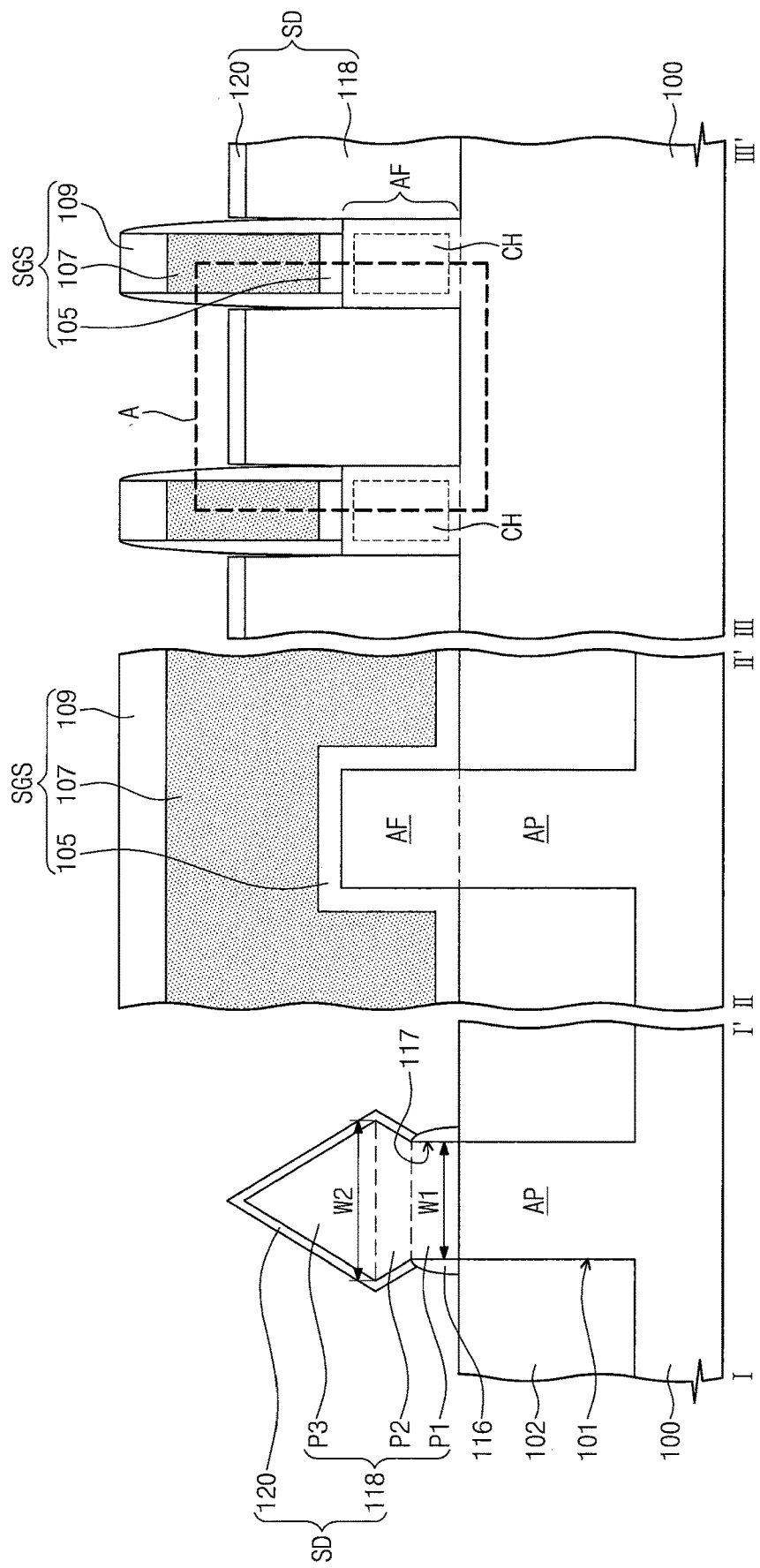

Referring to FIGS. 6A and 6B, source/drain regions SD may be formed on the active pattern AP between the sacrificial gate structures SGS and at opposite sides of the sacrificial gate structures SGS. Each of the source/drain regions SD may include a first epitaxial pattern 118 and a second epitaxial pattern 120 sequentially formed.

In more detail, the first epitaxial pattern 118 may be formed by performing a selective epitaxial growth (SEG) process using the active pattern AP as a seed layer. In some embodiments, the first epitaxial pattern 118 may include a first portion P1 in, and in some embodiments filling, the grooves 117, a second portion P2 having a width increasing with distance away from the substrate 100, and third portion P3 having a width decreasing with being far away from the substrate 100. The first portion P1 of the first epitaxial pattern 118 may have a width corresponding to the first width W1 of the grooves 117. The first epitaxial pattern 118 may have a maximum width at a boundary between the second portion P2 and the third portion P3. According to the inventive concepts, the auxiliary spacers 116 may include nitride. During the selective epitaxial process to form the first epitaxial pattern 118, the migration of the particles of the first epitaxial pattern 118 may be easier on nitride than on the oxide. That is, vertical migration of particles of the first epitaxial pattern 118 may increase on a sidewall of the auxiliary spacers 116 which is formed of nitride. Thus, the (100) plane of the first portion P1 of the first epitaxial pattern 118 may be easily grown and the first portion P1 of the first epitaxial pattern 118 may be formed of a uniformly grown epitaxial layer.

The semiconductor device including the first epitaxial pattern 118 may be an NMOS transistor. In some embodiments, the first epitaxial pattern 118 may be formed of a material having a lattice constant equal to or less than that of the substrate 100 in order to improve the performance of the NMOS transistor. For example, when the substrate 100 is a silicon substrate, the first epitaxial pattern 118 may include an SiC layer having a lattice constant less than that of silicon (Si) and/or an Si layer equal to that of the substrate 100. Therefore, the first epitaxial pattern 118 may induce a tensile strain to the channel region CH of the active fin AF. As a result, a mobility of electrons, which are majority carriers, may be increased in the channel region CH of the NMOS transistor.

A second epitaxial pattern 120 may be formed on the first epitaxial pattern 118. In detail, the second epitaxial pattern 120 may be formed on, and in some embodiments to cover, the second and the third portions P2 and P3 of the first epitaxial patterns 118. In other words, the second epitaxial pattern 120 may be formed along a sidewall profile of the second and the third portions P2 and P3 of the first epitaxial patterns 118. In some embodiments, the second epitaxial pattern 120 may be formed by a SEG process using the first epitaxial pattern 118 as a seed layer. The process for forming the second epitaxial pattern 120 may be performed in the same chamber in which the process for forming the first epitaxial pattern 118 is performed. That is, the processes for forming the first and the second epitaxial patterns 118 and 120 may be performed in an in-situ manner.

In some embodiments, the second epitaxial pattern 120 may include the same material as the first epitaxial pattern 118. For example, when the first epitaxial pattern 118 may comprise silicon (Si), the second epitaxial pattern 120 may also comprise silicon (Si). In this case, a process for forming the second epitaxial pattern 120 may be performed at a chamber pressure lower than that at which a process of forming the first epitaxial pattern 118 is performed. For example, the first epitaxial pattern 118 may be formed at a chamber pressure of about 200 Torr to about 300 Torr and the second epitaxial pattern 120 may be formed at a chamber pressure of about 1 Torr to about 10 Torr.

In other embodiments, the second epitaxial pattern 120 may have a lattice constant greater than that of the first epitaxial pattern 118. For example, when the first epitaxial pattern 118 comprises silicon (Si), the second epitaxial pattern 120 may comprise silicon germanium (SiGe). In this case, a germanium (Ge) concentration of the second epitaxial pattern 120 may have a range of about 1 to about 10 atom %. In still other embodiments, the second epitaxial pattern 120 may include the Si layer and the SiGe layer sequentially stacked.

In general, the substrate may include single crystalline silicon and the source/drain regions may be formed by a selective epitaxial growth (SEG) process using the substrate as a seed layer. In this case, the source/drain regions may be grown on (100) and (110) crystal planes of the silicon lattice and sidewalls of the source/drain regions may have a (111) crystal plane because a growth rate of an epitaxial layer is different according to a crystallographic orientation of a surface used a seed layer during an epitaxial growth process. On the other hand, a difference in growth rates of silicon (Si) epitaxial layer depending on crystal planes and directions of Si seed layer may be relatively less than a difference in growth rates of silicon germanium (SiGe) epitaxial layer. Therefore, when the source/drain regions are formed of a single silicon epitaxial layer, as is conventionally the case, it may be difficult to form the source/drain regions having sidewall surfaces with a (111) crystal plane as compared with the source/drain regions formed of a silicon germanium epitaxial layer. Thus, when the sidewall surfaces of the source/drain regions may have the (111) crystal plane, a surface roughness of the sidewall surfaces of the source/drain regions formed of the Si epitaxial layer may be relatively poor as compared with the source/drain regions formed of the SiGe epitaxial layer.

According to the inventive concepts, the surface roughness of the source/drain regions SD including the first and second epitaxial patterns 118 and 120 may be improved as compared with the source/drain regions including only the first epitaxial pattern 118, as is conventionally the case. In detail, as shown FIG. 10B, if the source/drain regions SD include only the first epitaxial pattern 118 (e.g., the Si layer), as is conventionally the case, a surface of the source/drain regions SD may have a rough or irregular surface due to the difference in the growth rates depending on the crystal planes and directions. On the other hand, as shown FIG. 10A, if the source/drain regions SD include the first and second epitaxial patterns 118 and 120 according to various embodiments of the inventive concepts, a surface of the source/drain regions SD of FIG. 10A may have a surface which is more flat than that of the source/drain regions SD of FIG. 10B. In more detail, a local roughness of the source/drain regions SD, (i.e., a surface roughness in one cross-sectional surface of the source/drain regions SD) may be improved from about 7.1 nm (FIG. 10B) to about 0.8 nm (FIG. 10A). Furthermore, a local variation between the source/drain regions SD may be improved from about 7.7 nm (FIG. 10B) to about 2.1 nm (FIG. 10A). Herein, the local roughness may be obtained by converting vertical heights h1$i$ and h2$i$ (here, i=1, 2, . . . , n) based on three-sigma rule. Each of vertical heights h1$i$ and h2$i$ (here, i=1, 2, . . . , n) is defined by a vertical distance between horizontal line 119$i$, which extends from an interface between the channel region CH and the gate dielectric pattern 135, and the surface of the source/drain regions SD measured per predetermined distance n. A local variation may be obtained by converting the local roughness of each of the source/drain regions SD based on three-sigma rule. Accordingly, FIG. 10B illustrates embodiments wherein an outer surface of the second epitaxial pattern 120 is smoother than an outer surface of the first epitaxial pattern 118 at a boundary between the first and second epitaxial patterns. The surface roughness of the source/drain regions SD may be improved as described above, and thus, electrical performance of the NMOS transistor including the first and second epitaxial patterns 118 and 120 may be improved.

Figure 7A:
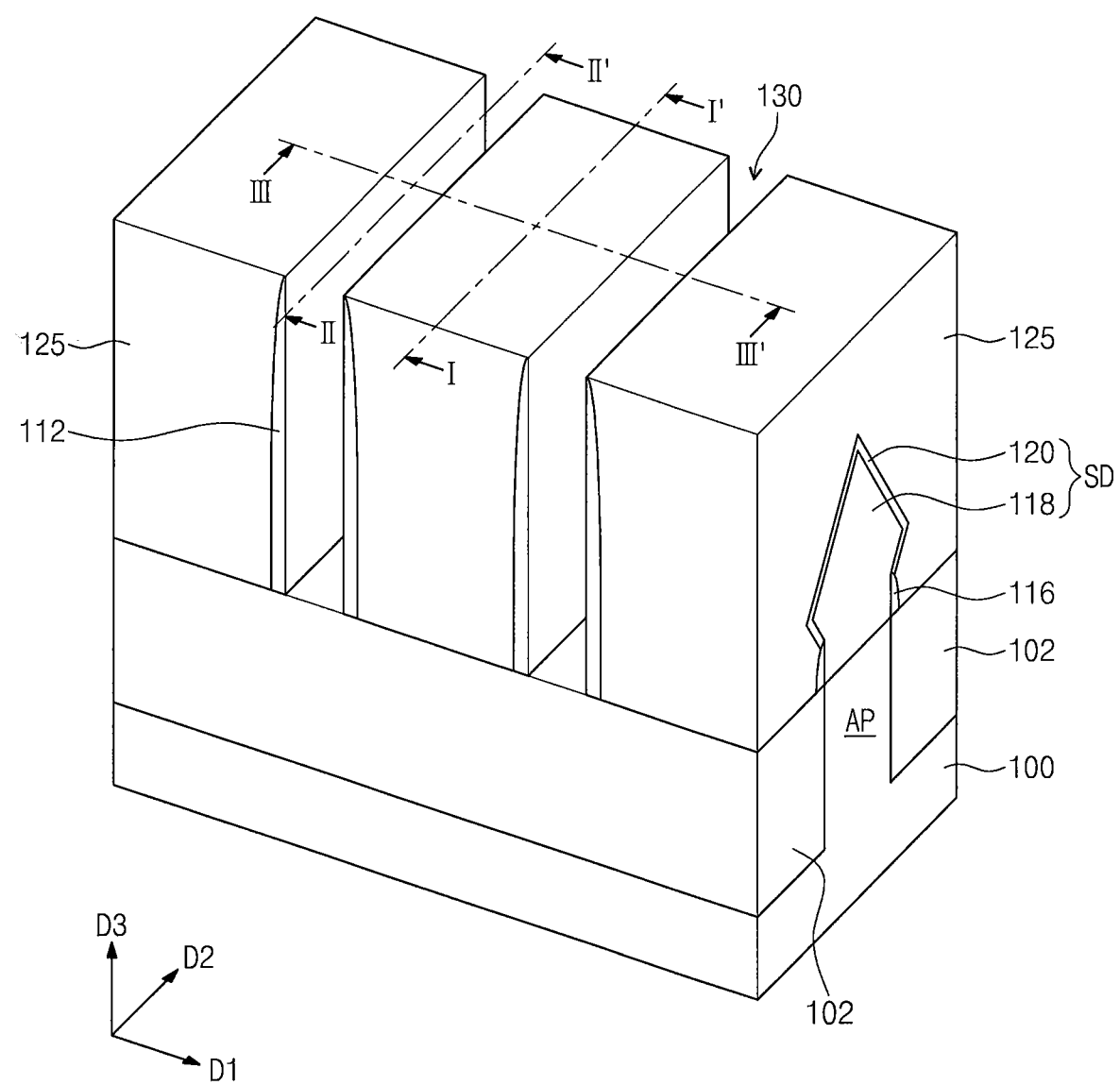
Figure 7B:
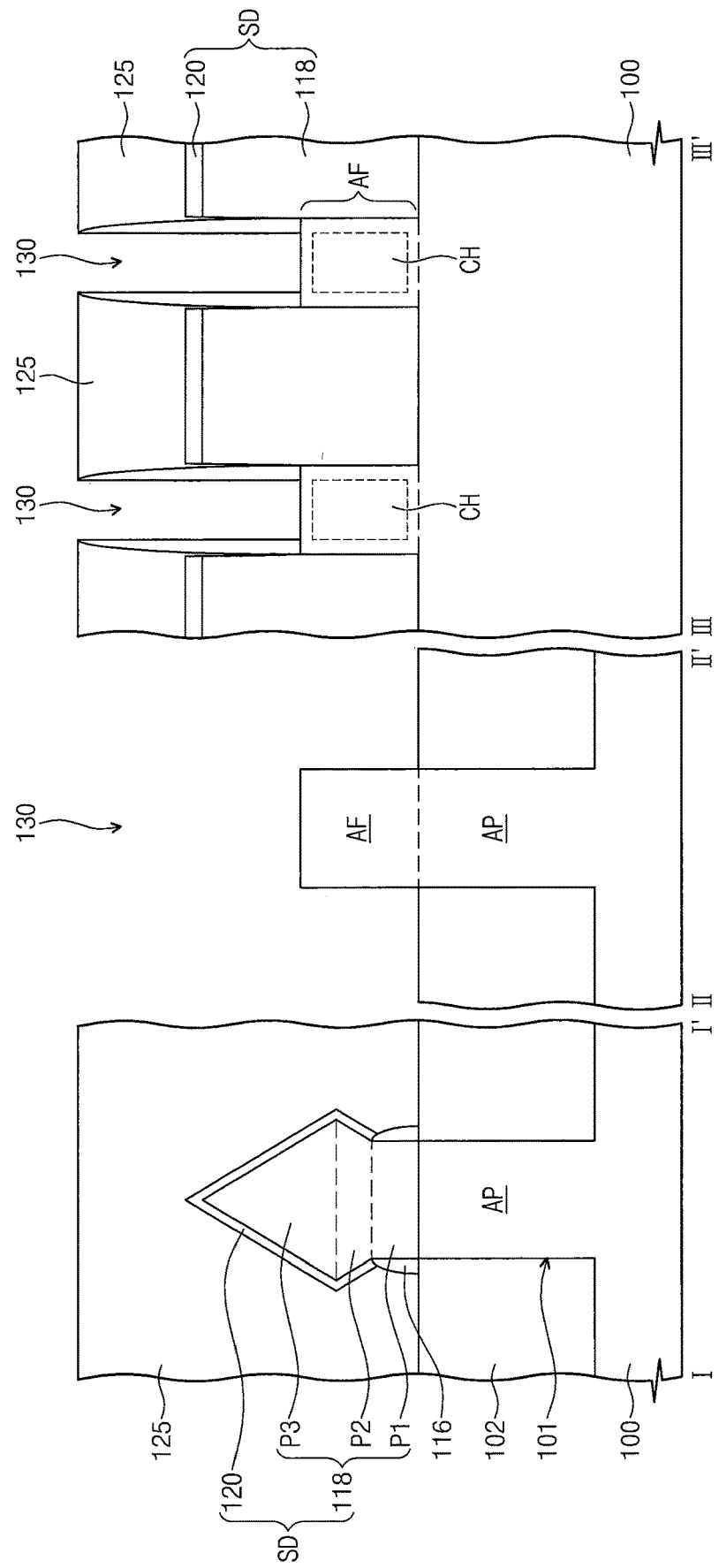

Referring to FIGS. 7A and 7B, a first interlayer insulating layer 125 may be formed on the substrate 100 provided the source/drain regions SD. The first interlayer insulating layer 125 may cover the source/drain regions SD and the sacrificial gate structures SGS. The first interlayer insulating layer 125 may include silicon oxide, silicon nitride, silicon oxynitride and/or low-k dielectric materials. Hereafter, a planarizing process for the first interlayer insulating layer 125 may be performed to expose top surfaces of the sacrificial gate patterns 107 of FIGS. 6A and 6B. The planarizing process may include an etch-back process and/or CMP (Chemical Mechanical Polishing) process.

Next, the sacrificial gate patterns 107 and the etch stop patterns 105 may be removed. As a result, gap regions 130 may be formed to expose channel regions CH of the active fin AF between the gate spacers 112. The gap regions 130 may extend in the second direction D2. The gap regions 130 may be formed by performing an etching process for selectively removing the sacrificial gate patterns 107 and the etch stop patterns 105.

Figure 8A:
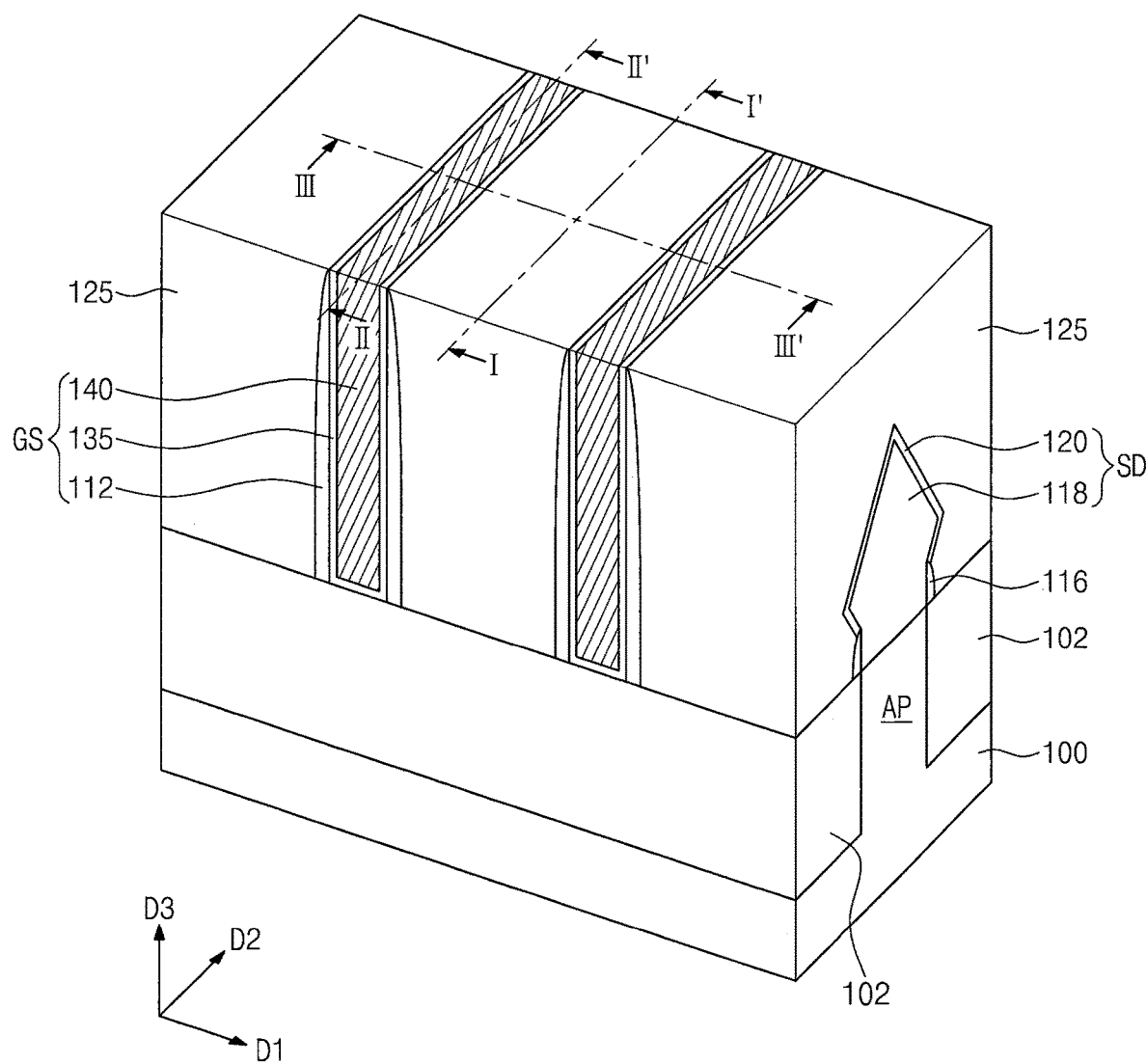

Referring to FIGS. 8A and 8B, a gate dielectric pattern 135 and a gate electrode 140 may be sequentially formed in each of the gap regions 130. First, the gate dielectric layer may be formed on the substrate 100 provided the gap regions 130. The gate dielectric layer may be conformally formed without completely filling the gap regions 130. In other words, the gate dielectric layer may extend on, and in some embodiments may cover, the channel regions CH and extend to a top surface of the first interlayer insulating layer 125 and a sidewall of the gate spacers 112 exposed by the gap regions 130. In some embodiments, the gate dielectric layer may be formed of high-k dielectric materials having a dielectric constant higher than that of silicon oxide. For example, the gate dielectric layer may include hafnium oxide, hafnium silicate, zirconium oxide and/or zirconium silicate. The gate dielectric layer may be formed by performing a chemical vapor deposition (CVD) process and/or an atomic layer deposition (ALD) process.

Next, the gate electrode layer on the gate dielectric layer may be formed in, and in some embodiments to fill, the gap regions 130, and then, a planarizing process for the gate electrode layer and the gate dielectric layer may be performed to expose a top surface of the first interlayer insulating layer 125. As a result, the gate dielectric pattern 135 and the gate electrode 140 may be locally formed in each of the gap regions 130. The gate dielectric pattern 135 and the gate electrode 140 may extend in the second direction D2. In some embodiments, the gate electrode layer may include at least one metal material. For example, the gate electrode layer may include titanium, tungsten, tantalum and/or aluminum. In other embodiments, the gate electrode layer may include conductive metal nitride (e.g., titanium nitride and/or tantalum nitride) and metal (e.g., aluminum and/or tungsten) stacked in a sequential manner. The gate electrode 140, the gate spacer 112, and the gate dielectric pattern 135 may constitute the gate structure GS.

Figure 9A:
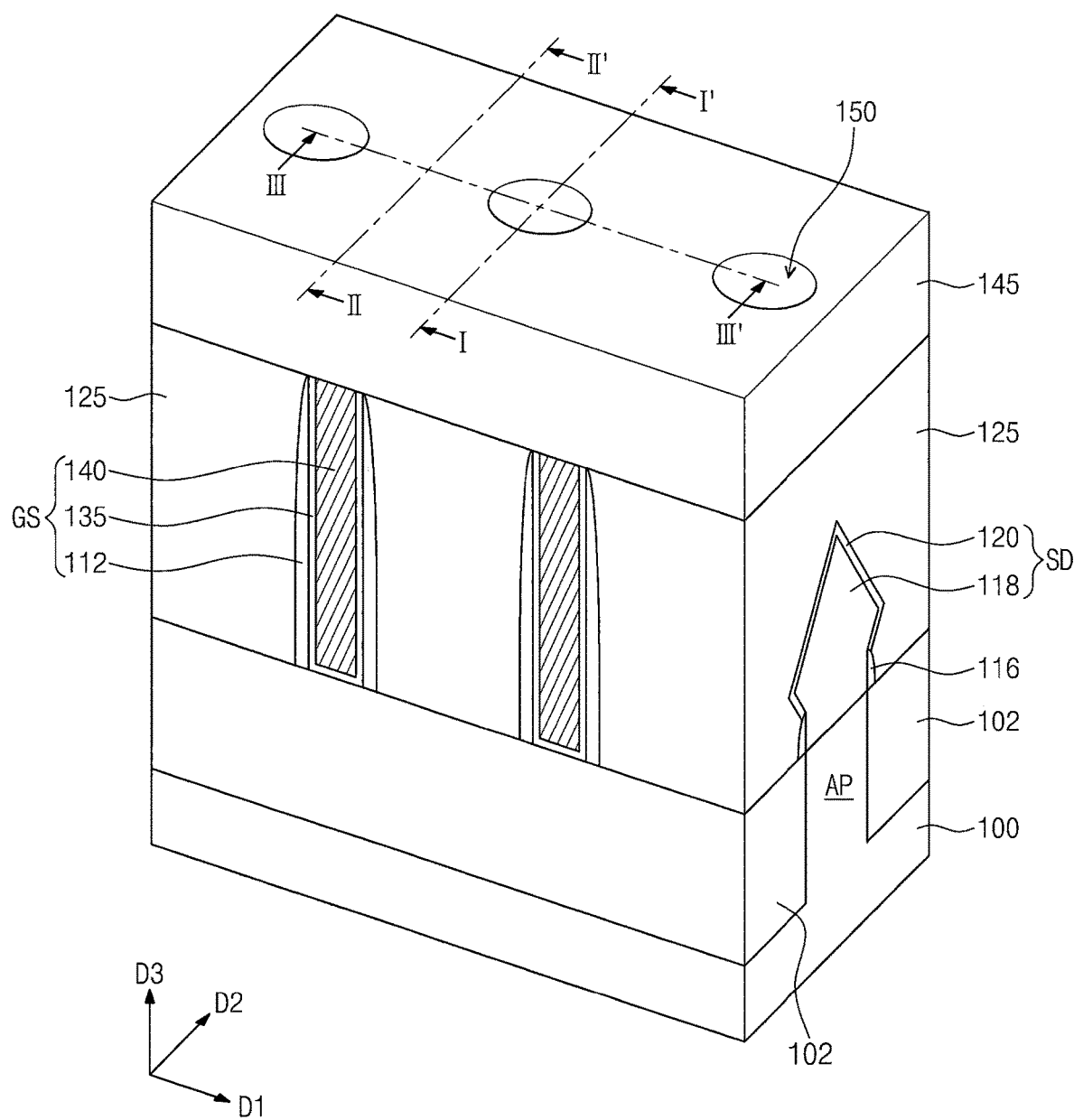
Figure 9B:
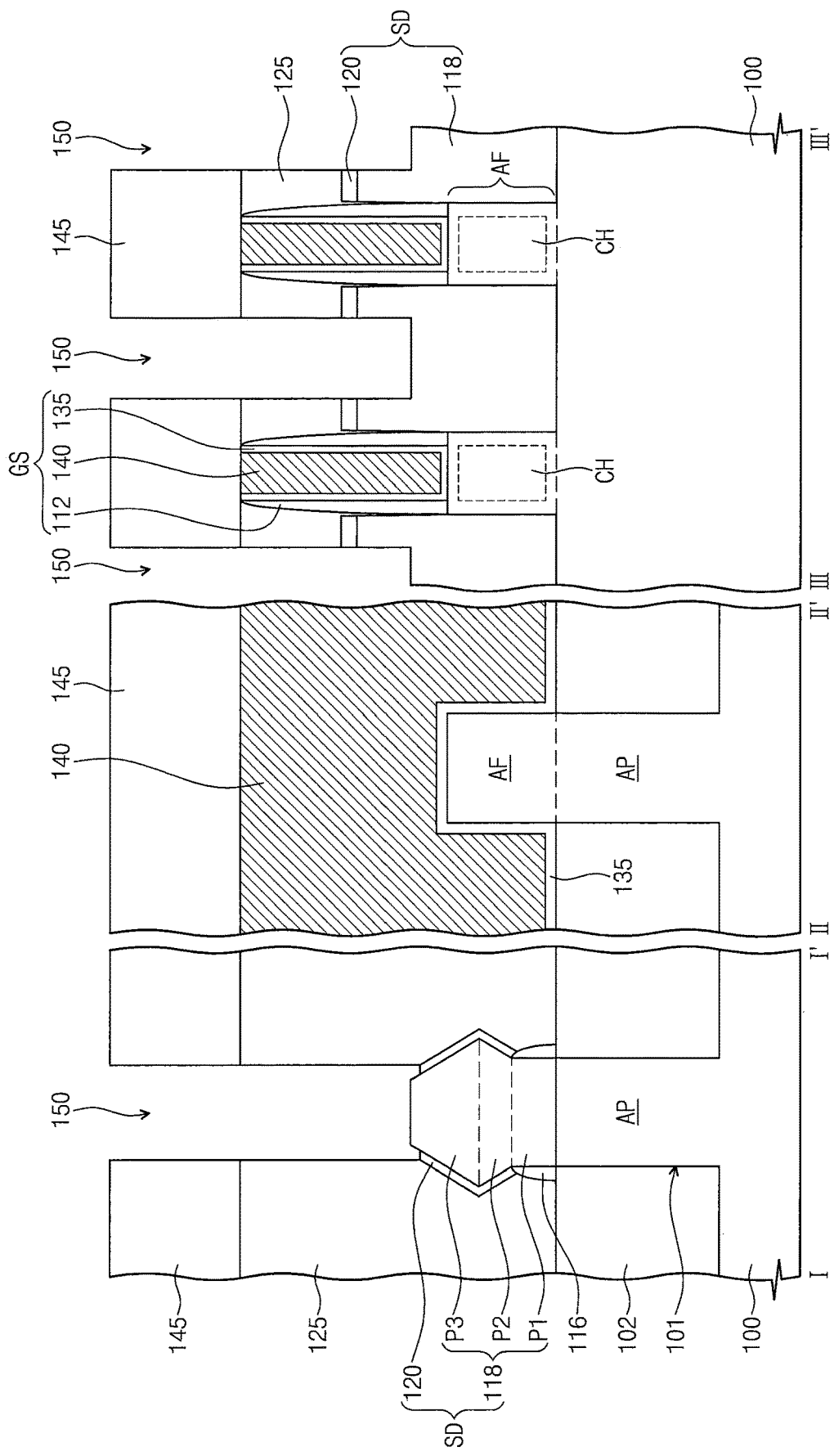
Figure 10A:
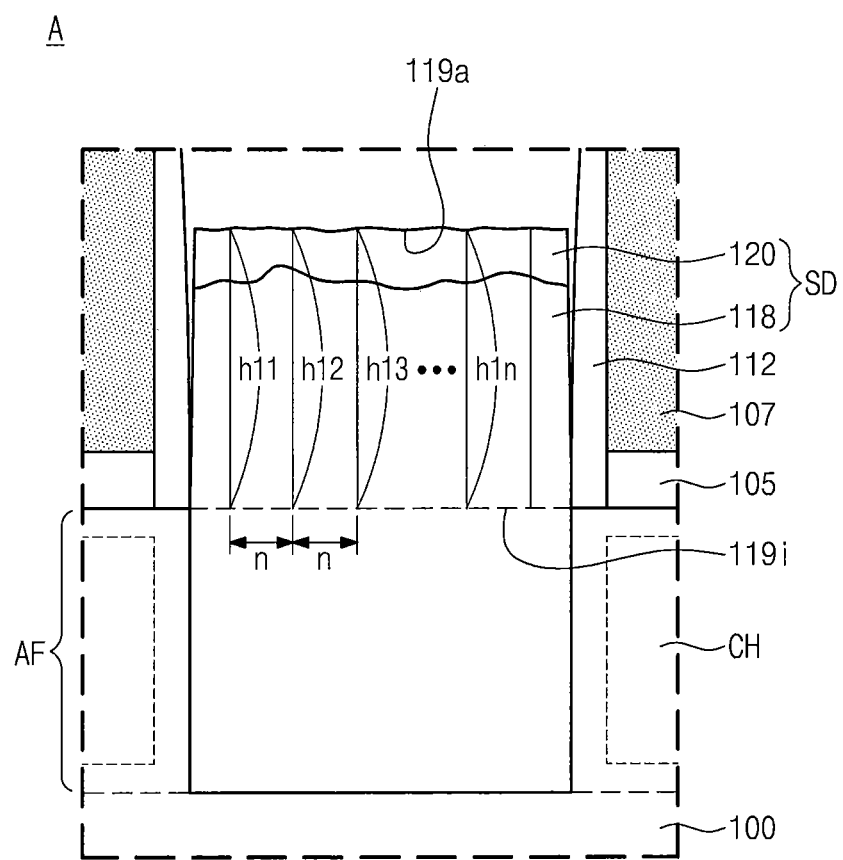
FIGS. 10A and 10B are enlarged views of a portion 'A' of FIG. 6B to show surface roughness of source/drain regions according to some embodiments of the inventive concepts.
Figure 10B:
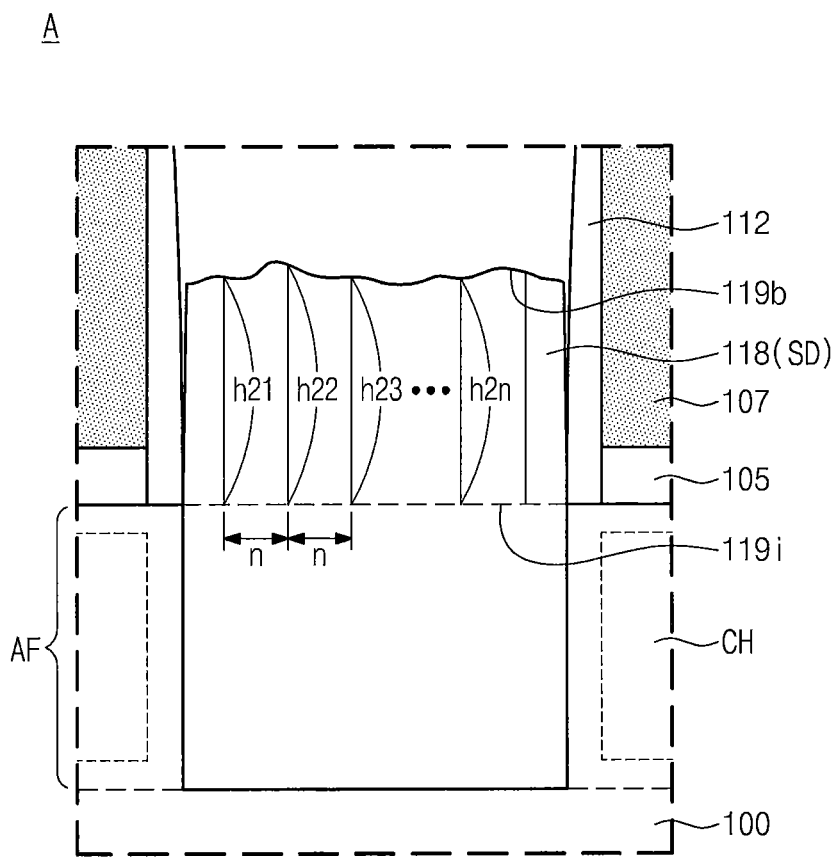

Referring to FIGS. 9A and 9B, a second interlayer insulating layer 145 may be formed on the substrate 100 provided the gate electrode 140. The second interlayer insulating layer 145 may include silicon oxide, silicon nitride, silicon oxynitride and/or low-k dielectric layers. The second interlayer insulating layer 145 may be formed by a CVD process.

Next, contact holes 150 may be formed to penetrate the first and second interlayer insulating layers 125 and 145. The contact holes 150 may expose the source/drain regions SD. In detail, the method of forming the contact holes 150 may include forming a mask pattern (not shown) on the second interlayer insulating layer 145, and then, performing an anisotropic etching process using the mask patterns as an etch mask. Herein, the mask patterns may define locations of the contact holes 150, in a plan view. The anisotropic etching process may further include etching an upper portion of the source/drain regions SD exposed by the contact holes 150. As a result, each of the source/drain regions SD may have a top surface exposed by the contact hole 150 and being parallel to the top surface of the substrate 100. In more detail, during the anisotropic etching process for forming the contact holes 150, a portion of the second epitaxial pattern 120 exposed by the contact holes 150 may be etched, and a portion of the first epitaxial pattern 118 under the second epitaxial pattern 120 may be partially etched. As a result, the portion of the first epitaxial pattern 118 may have a flat surface.

Referring again to FIGS. 1A and 1B, a silicide pattern 155 may be formed on the top surface of the source/drain regions SD exposed by each of the contact holes 150. The silicide pattern 155 may be formed by reacting between metal materials and the first epitaxial pattern 118 exposed by the contact holes 155. For example, the silicide pattern 155 may be formed of nickel silicide, cobalt silicide, tungsten silicide, titanium silicide, niobium silicide and/or tantalum silicide.

Next, contact plugs 160 may be formed to connect the silicide patterns 155 in the contact holes 150. In detail, forming the contact plugs 160 may include forming a conductive layer on the substrate provided the contact holes 150 to fill the contact holes 150, and then, planarizing the deposited conductive layer to expose the top surface of the second interlayer insulating layer 145. The conductive layer may include metal materials (e.g., tungsten). In some embodiments, forming the conductive layer may include sequentially depositing a barrier metal layer (e.g., metal nitride) and a metal layer (e.g., tungsten). As not shown, interconnection layers may be formed on the second interlayer insulating layer 145 to connect the contact plugs 160. The interconnection layer may include conductive materials.

According to some embodiments, the source/drain regions SD may be formed to include the first and second epitaxial patterns 118 and 120. The first epitaxial pattern 118 may be configured to induce the tensile strain to the channel region. The second epitaxial pattern 120 may include an Si layer formed under low pressure conditions and/or a SiGe layer. Therefore, the surface roughness of the source/drain regions SD may be improved and electrical performance of the NMOS transistor including the first and second epitaxial patterns 118 and 120 may be improved. This means that the reliability of the semiconductor memory device may be improved.

Figure 11A:
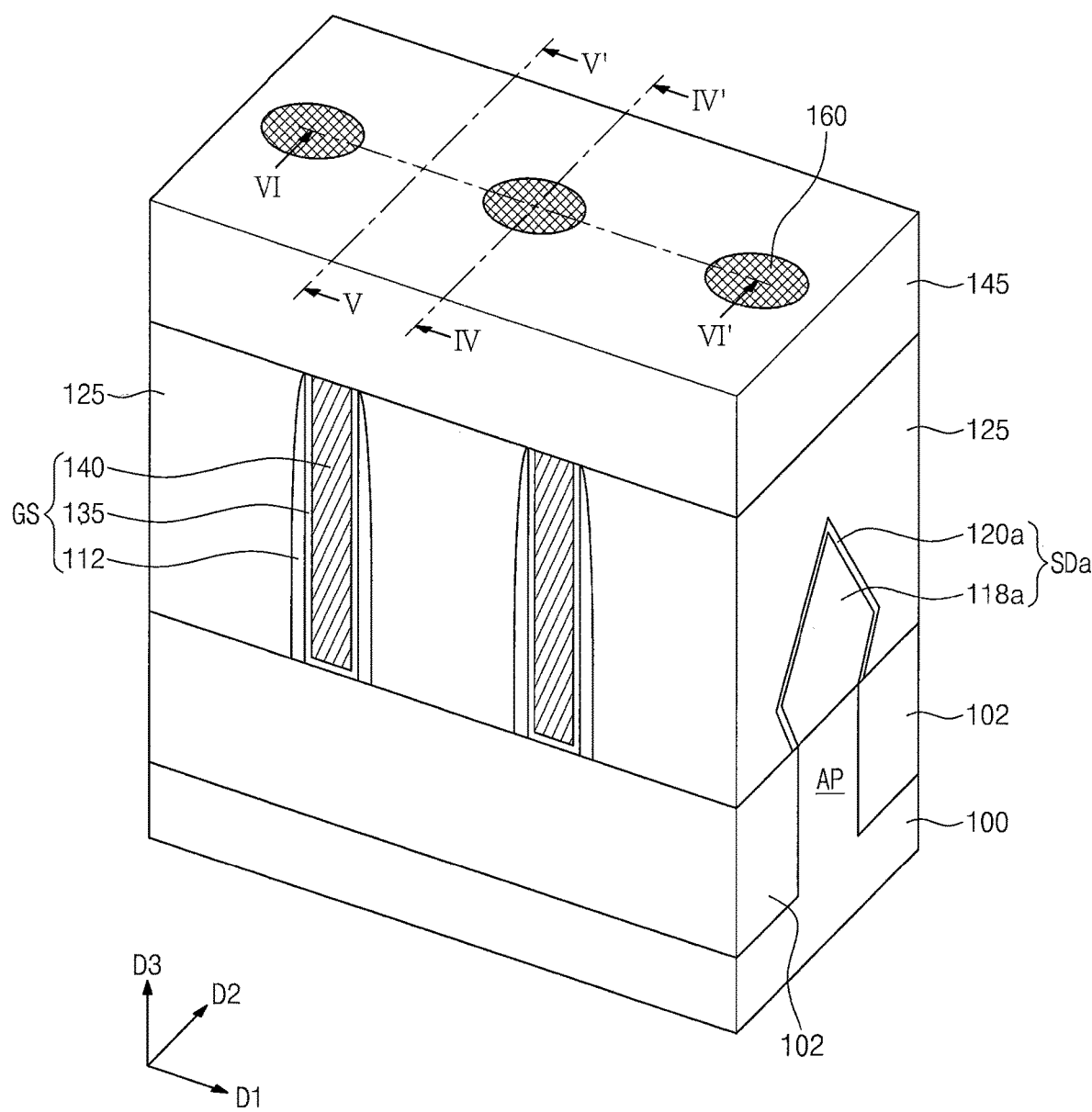
FIG. 11A is a perspective view illustrating a semiconductor device according to other embodiments of the inventive concepts.
Figure 11B:
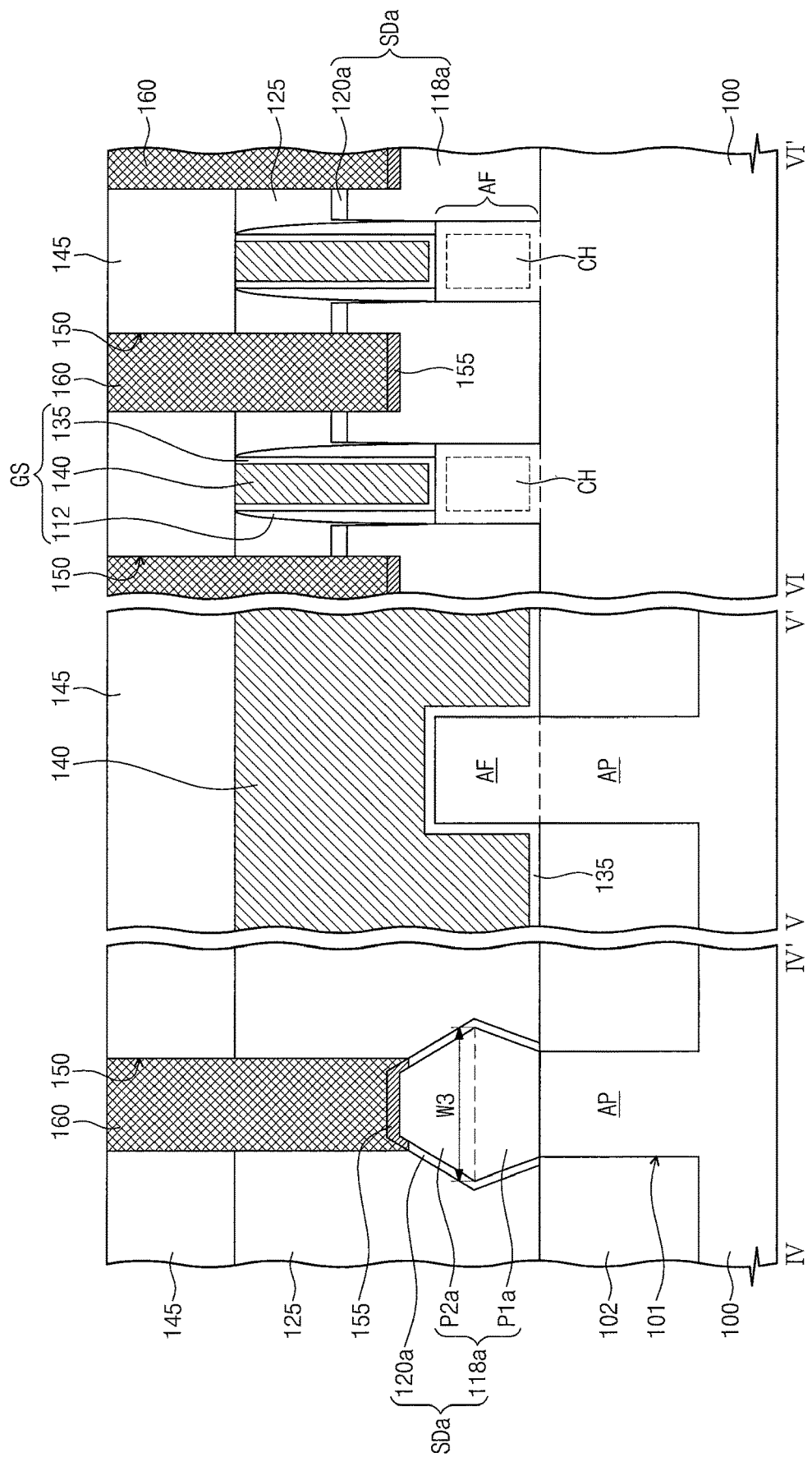
FIG. 11B is a cross-sectional view taken along lines IV-IV', V-V', and VI-VI' of FIG. 11A.

FIG. 11A is a perspective view illustrating a semiconductor device according to other embodiments of the inventive concepts. FIG. 11B is a cross-sectional view taken along lines of IV-IV', V-V', and VI-VI' of FIG. 11A. As has been the case, the elements and features of this example that are similar to those previously shown and described with reference to FIGS. 1A and 1B will not be described in much further detail for the sake of brevity.

Referring to FIGS. 11A and 11B, source/drain regions SDa may be disposed on the active pattern AP at opposite sides of the pair of the gate structures GS and between the pair of the gate structures GS. Each of the source/drain regions SDa may include a first epitaxial pattern 118a formed using the active pattern AP as a seed layer and a second epitaxial pattern 120a on the first epitaxial pattern 118a. In detail, the first epitaxial pattern 118a may include a first portion P1a contacting the active pattern AP and a second portion P2a on the first portion P1a. The first portion P1a may have a width increasing with distance away from the substrate 100. The second portion P2a may have a width decreasing with distance away from the substrate 100. As a result, the first epitaxial pattern 118a may have a third width W3 which is a maximum width at a boundary between the first portion P1a and the second portion P2a. The second epitaxial pattern 120a may extend on, and in some embodiments cover, both sidewalls of the first and second portions P1a and P2a of the first epitaxial pattern 118a. The first and second epitaxial patterns 118a and 120a may be formed of the same materials and the same methods with the first and the second epitaxial patterns 118 and 120 of FIGS. 1A and 1B.

A method of a semiconductor device according to other embodiments may be the same as the method of the semiconductor device according to some embodiments described in FIGS. 1A to 9A and 1B to 9B, except that fin spacers 114 of FIGS. 4A and 4B may be entirely removed when the sacrificial regions SR of FIGS. 4A and 4B are removed in the step of FIGS. 5A and 5B.

Figure 12:
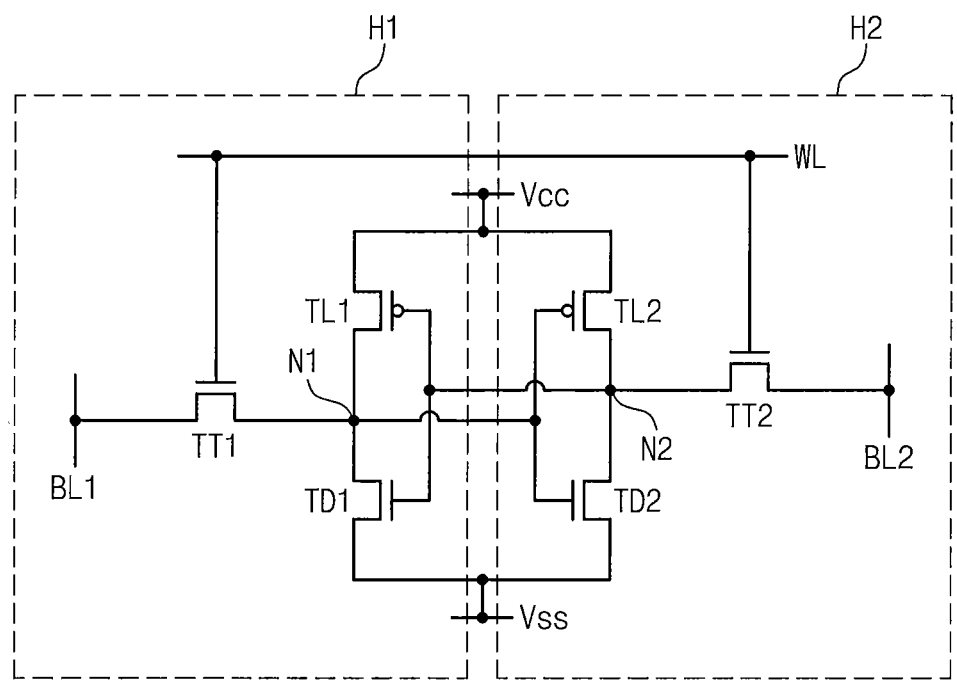
FIG. 12 is an equivalent circuit diagram illustrating a CMOS SRAM cell (Complementary metal-oxide-semiconductor Static Random Access Memory cell) including a semiconductor device according to some embodiments of the inventive concepts.

FIG. 12 is an equivalent circuit diagram illustrating a CMOS SRAM cell including a semiconductor device according to an example embodiment of the inventive concepts. Referring to FIG. 12, the CMOS SRAM cell may include a pair of driver transistors, e.g., a first driver transistor TD1 and a second driver transistor TD2, a pair of transfer transistors, e.g., a first transfer transistor TT1 and a second transfer transistor TT2, and a pair of load transistors, e.g., a first load transistor TL1 and a second load transistor TL2. The first and second driver transistors TD1 and TD2 may be pull-down transistors. The first and second transfer transistors TT1 and TT2 may be pass transistors. The first and second load transistors TL1 and TL2 may be pull-up transistors. The first and second driver transistors TD1 and TD2 and the first and second transfer transistors TT1 and TT2 may be formed of a NMOS transistor, respectively. The first and second load transistors TL1 and TL2 may be formed of a PMOS transistor, respectively. The field effect transistor according to an example embodiment of the inventive concepts may be applied to the driver transistors and/or the load transistors in some embodiments. In other embodiments, any or all of the transistors of FIG. 12 may be embodied by the inventive concepts.

The first driver transistor TD1 and the first transfer transistor TT1 may be connected in series each other. A source region of the first driver transistor TD1 may be electrically connected to a ground line Vss and a drain region of the first transfer transistor TT1 may be electrically connected to a first bit line BL1. The second driver transistor TD2 and the second transfer transistor TT2 may be connected in series. A source region of the second driver transistor TD2 may be electrically connected to a ground line Vss and a drain region of the second transfer transistor TT2 may be electrically connected to a second bit line BL2.

The drain region of the first load transistor TL1 may be electrically connected to a power supply line Vcc. The source region of the first load transistor TL1 may be electrically connected to the drain region of the driver transistor TD1. The drain region of the second load transistor TL2 may be electrically connected to the power supply line Vcc. The source region of the first load transistor TL1 may be electrically connected to the drain region of the driver transistor TD2. A first node N1 may include the drain region of the first load transistor TL1, the drain region of the first driver transistor TD1, and the source region of the first transfer transistor TT1. A second node may include the drain region of the second load transistor TL2, the drain region of the second driver transistor TD2, and the source region of the second transfer transistor TT2. The gate electrode of the first driver transistor TD1 and the gate electrode of the first load transistor TL1 may be electrically connected to the second node N2. The gate electrode of the second driver transistor TD2 and the gate electrode of the second load transistor TL2 may be electrically connected to the first node N1. The gate electrodes of the first and second transfer transistors TT1 and TT2 may be electrically connected to a word line WL. A first half H1 cell may comprise the first driver transistor TD1, the first transfer transistor TT1, and the first load transistor TL1. A second half cell H2 may comprise the second driver transistor TD2, the second transfer transistor TT2, and the second load transistor TL2.

The present inventive concepts may apply to not only SRAM devices but also DRAM (Dynamic Random Access Memory) or MRAM (Magnetic Random Access Memory) devices, for example. They may also apply to logic devices.

Figure 13:
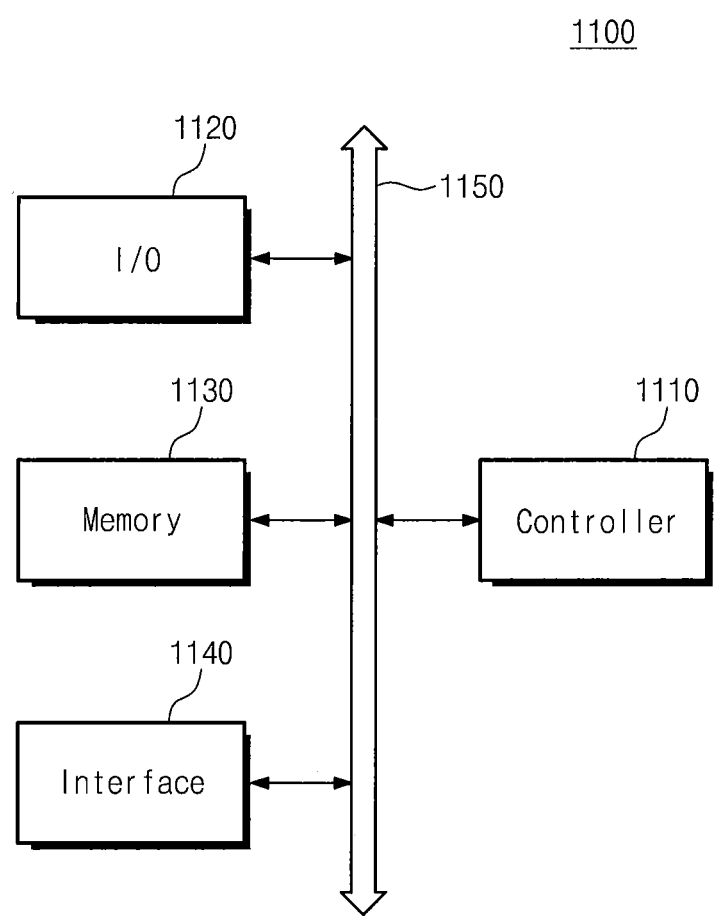
FIG. 13 is a schematic block diagram illustrating an electronic system including a semiconductor device according to some embodiments of the inventive concepts.

FIG. 13 is a schematic block diagram of a system including a semiconductor device according to an example embodiment of the inventive concepts.

Referring to FIG. 13, the system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path over which data can be moved between system elements.

The controller 1110 may comprise a microprocessor, a digital signal processor, a microcontroller and/or a similar device that can control an operating program. The input/output device 1120 may comprise a keypad, a keyboard, or a display. The memory device 1130 may not only save codes or data for executing the controller 1110 but also save data executed by the controller 1110. The memory device 1130 and/or other blocks of FIG. 13 may comprise a semiconductor device, which has an NMOS or PMOS transistor, according to an example embodiment of the inventive concepts.

The system 1100 may be applied to a product that can transport information, e.g., a PDA (personal digital assistant), a portable computer, a web tablet, a wireless phone, a mobile phone, a digital music player and/or a memory card.

Figure 14:
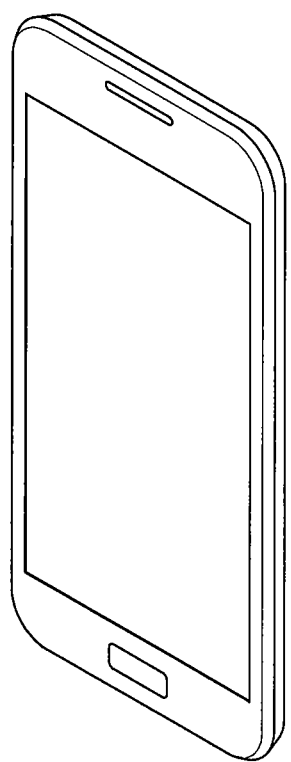
FIG. 14 is a perspective view illustrating a mobile phone including a semiconductor device according to some embodiments of the inventive concepts.

The system 1100 of FIG. 13 may be applied to other various products. FIG. 14 is a perspective view illustrating a mobile phone including the system 1100 of FIG. 13. In addition, the system 1100 of FIG. 13 may be applied to a portable notebook, a MP3 player, navigation system, a solid state disk (SSD), a car and/or a household appliance.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A semiconductor device comprising:
an active pattern protruding from a substrate;
a gate structure crossing over the active pattern;
source/drain regions on the active pattern at opposite sides of the gate structure,
wherein each of the source/drain regions includes a first epitaxial pattern contacting the active pattern and a second epitaxial pattern on the first epitaxial pattern, and
wherein the first epitaxial pattern comprises a material having a lattice constant which is the same, as that of the substrate, and the second epitaxial pattern comprises a material having a lattice constant greater than that of the first epitaxial pattern;
an interlayer insulating, layer comprising first portions on the source/drain regions and a second portion on the gate structure; and
contact plugs penetrating the first portions of the interlayer insulating, layer and the second epitaxial pattern and connected to the first epitaxial pattern,
wherein a bottom end portion of each of the contact plugs extends into the first epitaxial pattern.

2. The semiconductor device of claim 1, wherein the active pattern includes a channel region disposed between the source/drain regions and under the gate structure,
wherein the gate structure extends on side surfaces and a top surface of the channel region, and
wherein the top surface of the channel region is lower than an uppermost surface of the first epitaxial pattern and is higher than a lower surface of the first epitaxial pattern.

3. The semiconductor device of claim 1, wherein the first epitaxial pattern comprises:
a first portion contacting the active pattern;
a second portion extending from the first portion, the second portion having a width increasing with distance away from the substrate; and
a third portion extending from the second portion, the third portion having a width decreasing with distance away from the substrate,
wherein the first epitaxial pattern has a maximum width at a boundary between the second portion and the third portion.

4. The semiconductor device of claim 3, wherein the second epitaxial pattern extends on opposite sidewalls of the second and third portions.

5. The semiconductor device of claim 4, further comprising:
device isolation patterns disposed on the substrate at opposite sides of the active pattern; and
auxiliary spacers disposed on the device isolation patterns,
wherein the auxiliary spacers extend on the first portion and expose the second portion and the third portion.

6. The semiconductor device of claim 1, wherein the gate structure comprises:
a gate electrode crossing over the active pattern;
gate spacers on opposite sidewalls of the gate electrode; and
a gate dielectric pattern between the active pattern and the gate electrode,
wherein the active pattern extends in a first direction and the gate electrode extends in a second direction intersecting the first direction.

7. The semiconductor device of claim 1, wherein the first and the second epitaxial patterns include n-type impurities.

8. The semiconductor device of claim 1, wherein the first epitaxial pattern comprises silicon (Si) and the second epitaxial pattern comprises silicon germanium (SiGe).

9. The semiconductor device of claim 8, wherein a germanium (Ge) concentration of the second epitaxial pattern has a range of about 1 to about 10 atom %.

10. The semiconductor device, of claim 1, wherein the first epitaxial pattern comprises:
a first portion contacting the active pattern, the first portion having a width increasing with distance away from the substrate; and
a second portion extending from the first portion, the second portion having a width decreasing with distance away from the substrate,
wherein the first epitaxial pattern has a maximum width at a boundary between the first portion and the second portion, and
wherein the second epitaxial pattern is on opposite sidewalls of the first and second portions.

11. A semiconductor device comprising:
an active pattern protruding from a substrate;
a gate structure crossing over the active pattern;
source/drain regions on the active pattern at opposite sides of the gate structure,
wherein each of the source/drain regions includes a first epitaxial pattern contacting the active pattern and a second epitaxial pattern on the first epitaxial pattern, and
wherein the first epitaxial pattern comprises a material having a lattice constant that is the same as that of the substrate, and the second epitaxial pattern comprises a material having a lattice constant greater than that of the first epitaxial pattern;
an interlayer insulating layer on the gate structure; and
contact plugs penetrating the second epitaxial pattern and connected to the first epitaxial pattern,
wherein a bottom end portion of each of the contact plugs is lower than an uppermost surface of the first epitaxial pattern, and
wherein the bottom end portion of each of the contact plugs is higher than a lower surface of the gate structure.

12. The semiconductor device of claim 11, wherein the interlayer insulating layer comprises:
first portions on the source/drain regions; and
a second portion on the gate structure.

13. The semiconductor device of claim 12, wherein the contact plugs further penetrate the first portions of the interlayer insulating layer.

14. The semiconductor device of claim 11, wherein the bottom end portion of each of the contact plugs does not vertically overlap the gate structure.

15. A semiconductor device comprising:
a substrate comprising an active fin protruding therefrom;
a gate structure on the active fin;
source/drain region comprising a first epitaxial region contacting the active fin and a second epitaxial region on the first epitaxial region adjacent a side surface of the gate structure, wherein the first epitaxial region comprises a material having a lattice constant equal to that of the substrate, and the second epitaxial region comprises a material having a lattice constant greater than that of the first epitaxial region;
an interlayer insulating layer comprising a first portion on the source/drain region and a second portion on the gate structure; and
a contact plug that penetrates the first portion of the interlayer insulating layer and the second epitaxial region, wherein an end portion of the contact plug extends into the first epitaxial region.

16. The semiconductor device of claim 15,
wherein the side surface of the gate structure comprises a first side surface,
wherein the source/drain region comprises a first source/drain region,
wherein the semiconductor device further comprises a second source/drain region on a second side surface of the gate structure that is opposite the first side surface,
wherein the contact plug comprises a first contact plug, and
wherein the semiconductor device further comprises a second contact plug that extends into the second source/drain region.

17. The semiconductor device of claim 16,
wherein a third portion of the interlayer insulating layer is on the second source/drain region, and
wherein the second contact plug penetrates the third portion of the interlayer insulating layer.

18. The semiconductor device of claim 16, wherein, the first contact plug does not vertically overlap the gate structure, and the second contact plug does not vertically overlap the gate structure.

19. The semiconductor device of claim 15, further comprising silicide on the end portion of the contact plug.

20. The semiconductor device of claim 15, wherein the end portion of the contact plug is at a vertical level that is between a top surface of the gate structure and a bottom surface of the gate structure.

* * * * *